United States Patent
Seol et al.

(10) Patent No.: US 9,837,156 B2
(45) Date of Patent: Dec. 5, 2017

(54) STORAGE DEVICE AND OPERATING METHOD OF STORAGE DEVICE

(71) Applicants: Changkyu Seol, Osan-si (KR); Junjin Kong, Yongin-si (KR); JongHa Kim, Seongnam-si (KR); Hyejeong So, Seoul (KR); Hong Rak Son, Anyang-si (KR); Seonghyeog Choi, Hwaseong-si (KR)

(72) Inventors: Changkyu Seol, Osan-si (KR); Junjin Kong, Yongin-si (KR); JongHa Kim, Seongnam-si (KR); Hyejeong So, Seoul (KR); Hong Rak Son, Anyang-si (KR); Seonghyeog Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 36 days.

(21) Appl. No.: 14/640,653

(22) Filed: Mar. 6, 2015

(65) Prior Publication Data
US 2016/0011807 A1     Jan. 14, 2016

(30) Foreign Application Priority Data
Jul. 8, 2014  (KR) .................. 10-2014-0085334

(51) Int. Cl.
| G06F 3/06 | (2006.01) |
| G11C 16/10 | (2006.01) |
| G11C 7/10 | (2006.01) |
| G11C 11/56 | (2006.01) |

(52) U.S. Cl.
CPC ............ *G11C 16/10* (2013.01); *G11C 7/1006* (2013.01); *G11C 11/5628* (2013.01); *G11C 16/102* (2013.01)

(58) Field of Classification Search
None
See application file for complete search history.

(56) References Cited

U.S. PATENT DOCUMENTS

| | | | | |
|---|---|---|---|---|
| 6,158,041 | A * | 12/2000 | Raleigh | H03M 13/256 714/786 |
| 6,714,596 | B1 * | 3/2004 | Shiraishi | H04L 1/0052 375/262 |
| 7,609,548 | B2 | 10/2009 | Park | |
| 7,679,133 | B2 | 3/2010 | Son et al. | |
| 8,467,242 | B2 * | 6/2013 | Fernandes | G11C 11/5628 365/185.03 |
| 8,553,466 | B2 | 10/2013 | Han et al. | |
| 8,559,235 | B2 | 10/2013 | Yoon et al. | |

(Continued)

*Primary Examiner* — Sean D Rossiter
*Assistant Examiner* — Khoa D Doan
(74) *Attorney, Agent, or Firm* — Harness, Dickey & Pierce, P.L.C.

(57) ABSTRACT

The operating method of the storage device includes receiving write data to be written at the plurality of memory cells; determining whether the received write data is LSB data to be written at the plurality of memory cells; and encoding the write data according to the determination. The write data is encoded according to the write data when the write data is LSB data to be written at the plurality of memory cells. The write data is encoded according to the write data and encoding data of lower data of the write data to be written at the plurality of memory cells when the write data is not LSB data to be written at the plurality of memory cells.

19 Claims, 26 Drawing Sheets

(56) References Cited

U.S. PATENT DOCUMENTS

| | | | |
|---|---|---|---|
| 8,611,151 B1* | 12/2013 | Yang | G11C 16/28 365/185.03 |
| 8,654,587 B2 | 2/2014 | Yoon et al. | |
| 9,135,155 B2* | 9/2015 | Sharon | G06F 11/1012 |
| 9,223,692 B2* | 12/2015 | Kwak | G06F 12/0246 |
| 9,318,166 B2* | 4/2016 | Sharon | G06F 11/1044 |
| 2008/0019173 A1* | 1/2008 | Li | G11C 7/1045 365/185.02 |
| 2008/0080237 A1 | 4/2008 | Park | |
| 2009/0310418 A1* | 12/2009 | Cernea | G11C 11/5628 365/185.19 |
| 2010/0091535 A1* | 4/2010 | Sommer | G11C 8/20 365/45 |
| 2010/0131806 A1* | 5/2010 | Weingarten | G06F 11/1072 714/54 |
| 2010/0146192 A1* | 6/2010 | Weingarten | G11C 11/5628 711/103 |
| 2010/0157675 A1* | 6/2010 | Shalvi | G11C 16/04 365/185.03 |
| 2010/0195388 A1* | 8/2010 | Jung | G11C 11/5628 365/185.03 |
| 2010/0309726 A1* | 12/2010 | Yang | G11C 16/26 365/185.21 |
| 2011/0055297 A1 | 3/2011 | Maeda et al. | |
| 2011/0085379 A1* | 4/2011 | Kim | G11C 11/5628 365/185.03 |
| 2011/0090734 A1* | 4/2011 | Burger, Jr. | G06F 11/1072 365/185.03 |
| 2011/0093652 A1* | 4/2011 | Sharon | G06F 11/1072 711/103 |
| 2011/0233648 A1 | 9/2011 | Seol et al. | |
| 2011/0258371 A1* | 10/2011 | Yang | G11C 11/5642 711/103 |
| 2012/0005409 A1* | 1/2012 | Yang | G06F 12/0246 711/103 |
| 2012/0066436 A1* | 3/2012 | Yang | G11C 11/5628 711/103 |
| 2012/0166717 A1 | 6/2012 | Lin et al. | |
| 2012/0198135 A1* | 8/2012 | Chilappagari | G11C 11/5621 711/103 |
| 2013/0007559 A1* | 1/2013 | Motwani | G06F 11/1048 714/758 |
| 2013/0024605 A1* | 1/2013 | Sharon | G06F 11/1072 711/103 |
| 2013/0024743 A1 | 1/2013 | Sharon et al. | |
| 2013/0024747 A1* | 1/2013 | Sharon | G06F 11/1072 714/773 |
| 2013/0117606 A1* | 5/2013 | Anholt | G06F 11/1048 714/15 |
| 2013/0124784 A1* | 5/2013 | Woo | G06F 12/0246 711/103 |
| 2013/0191579 A1 | 7/2013 | Sharon et al. | |
| 2013/0259170 A1* | 10/2013 | Motwani | H04L 1/0054 375/341 |
| 2013/0275658 A1* | 10/2013 | Han | G06F 12/0246 711/103 |
| 2013/0318420 A1* | 11/2013 | Seol | G06F 11/1008 714/773 |
| 2013/0343125 A1* | 12/2013 | Gillingham | G11C 11/5628 365/185.03 |
| 2014/0045311 A1* | 2/2014 | Doo | H01L 29/66833 438/269 |
| 2014/0063939 A1* | 3/2014 | Marcu | G11C 16/0483 365/185.03 |
| 2014/0068379 A1* | 3/2014 | Sakaue | G06F 11/10 714/764 |
| 2014/0071761 A1* | 3/2014 | Sharon | G11C 16/26 365/185.18 |
| 2014/0143631 A1* | 5/2014 | Varanasi | G11C 7/1006 714/763 |
| 2014/0157086 A1* | 6/2014 | Sharon | G06F 11/1012 714/773 |
| 2014/0245098 A1* | 8/2014 | Sharon | G06F 11/1012 714/755 |
| 2015/0019933 A1* | 1/2015 | Yamazaki | G06F 11/1008 714/758 |
| 2015/0085573 A1* | 3/2015 | Sharon | G06F 11/1048 365/185.03 |
| 2016/0098319 A1* | 4/2016 | Gorobets | G11C 29/52 714/773 |

* cited by examiner

FIG. 7
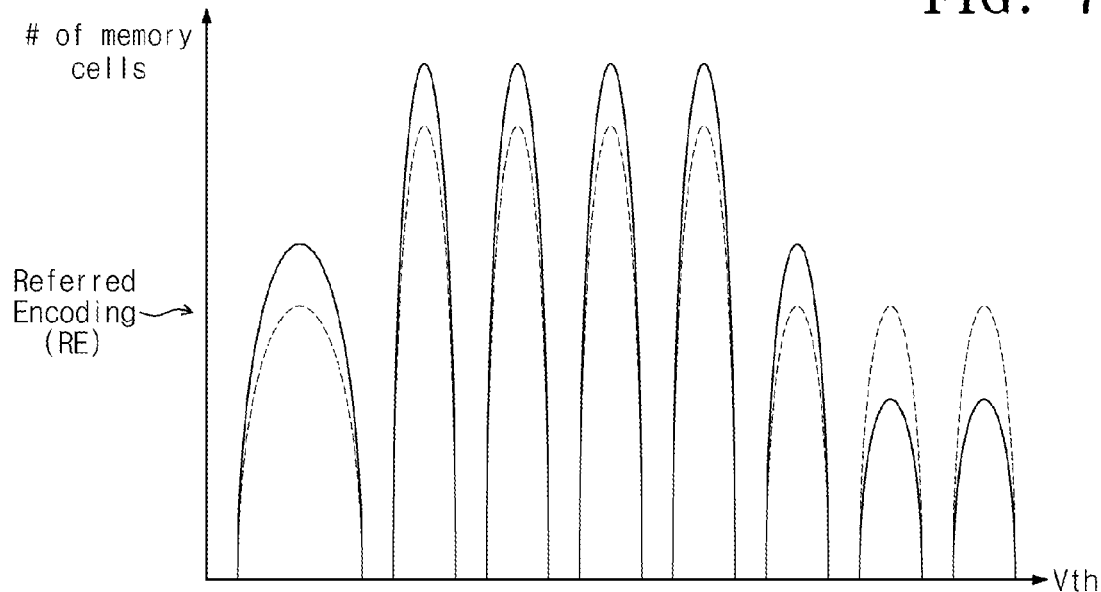
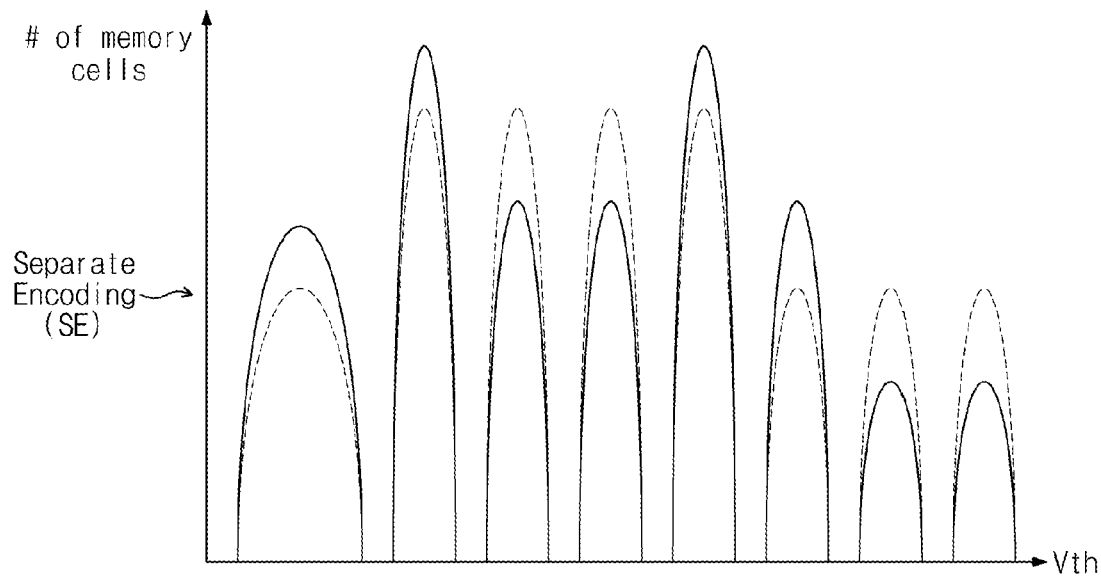

FIG. 8
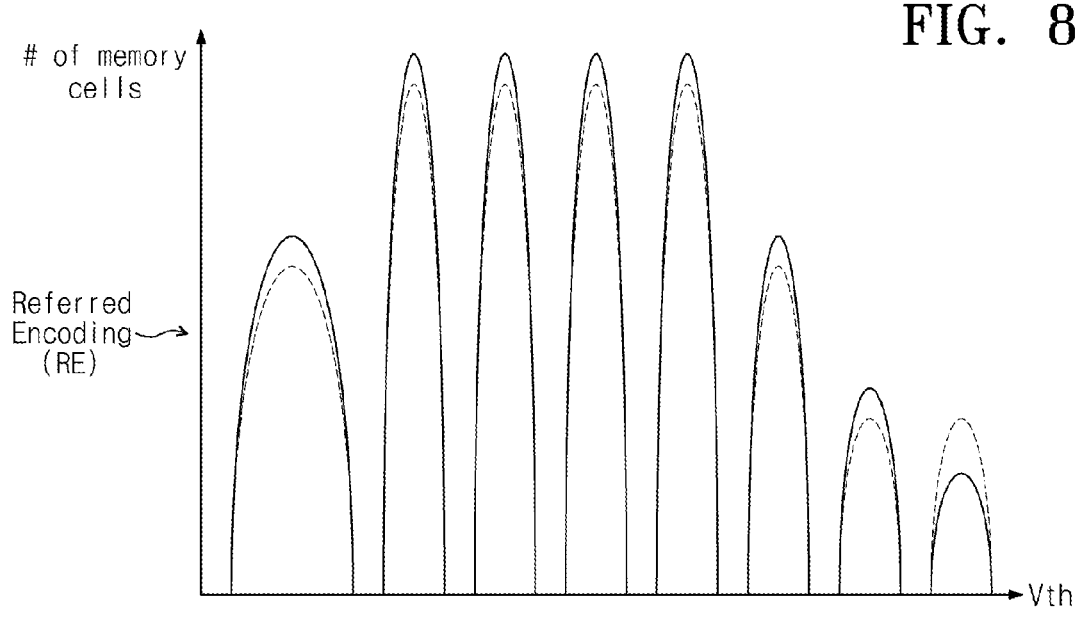
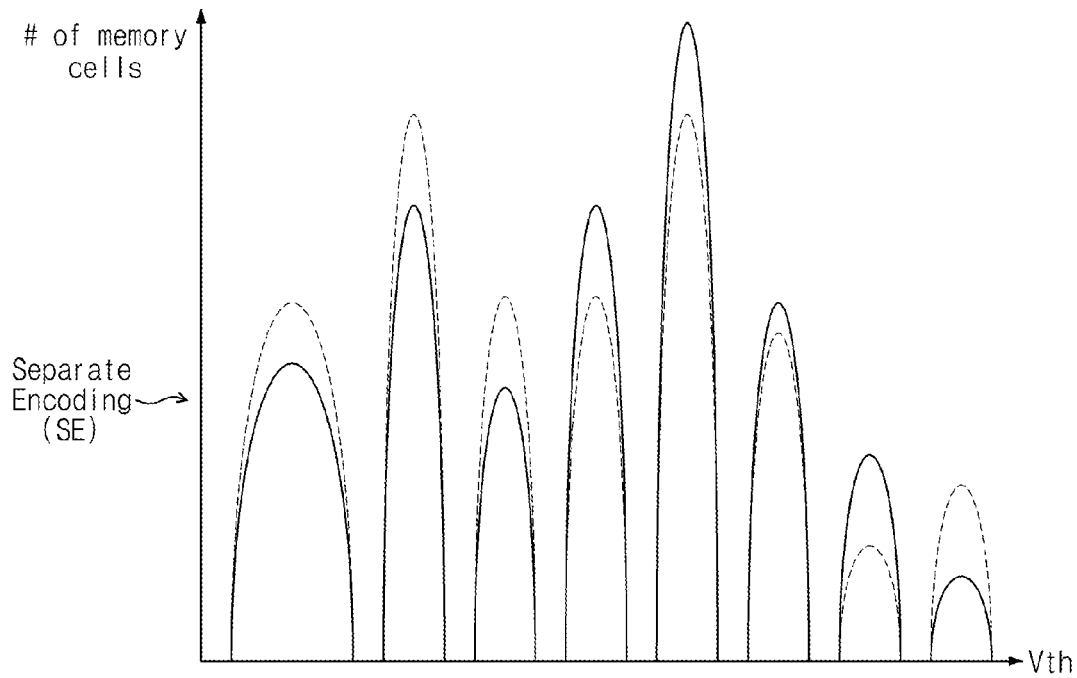

FIG. 9
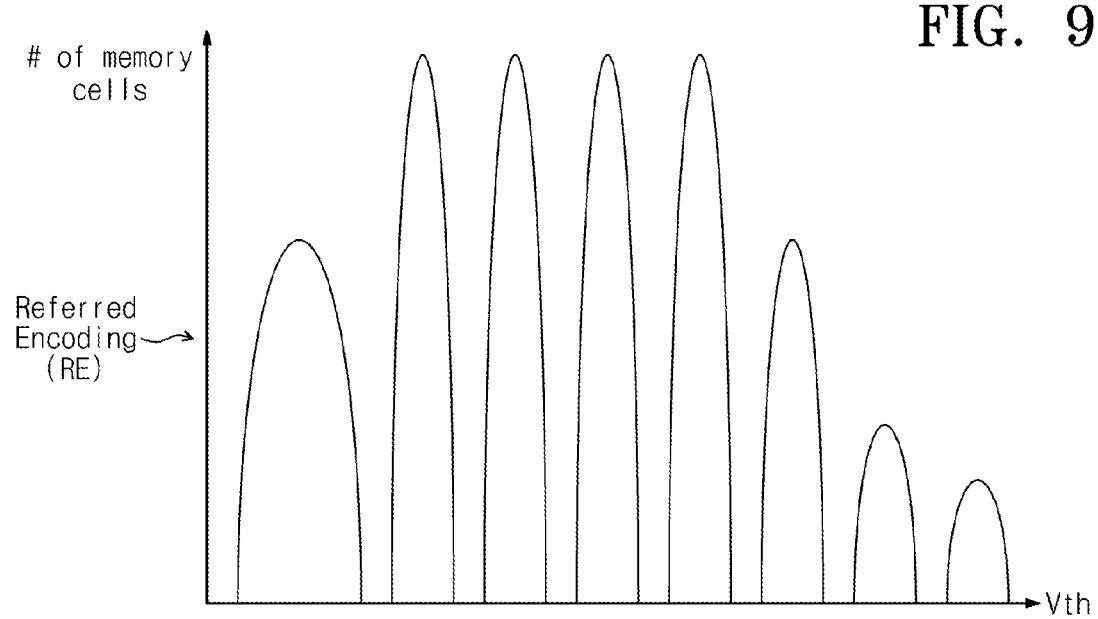
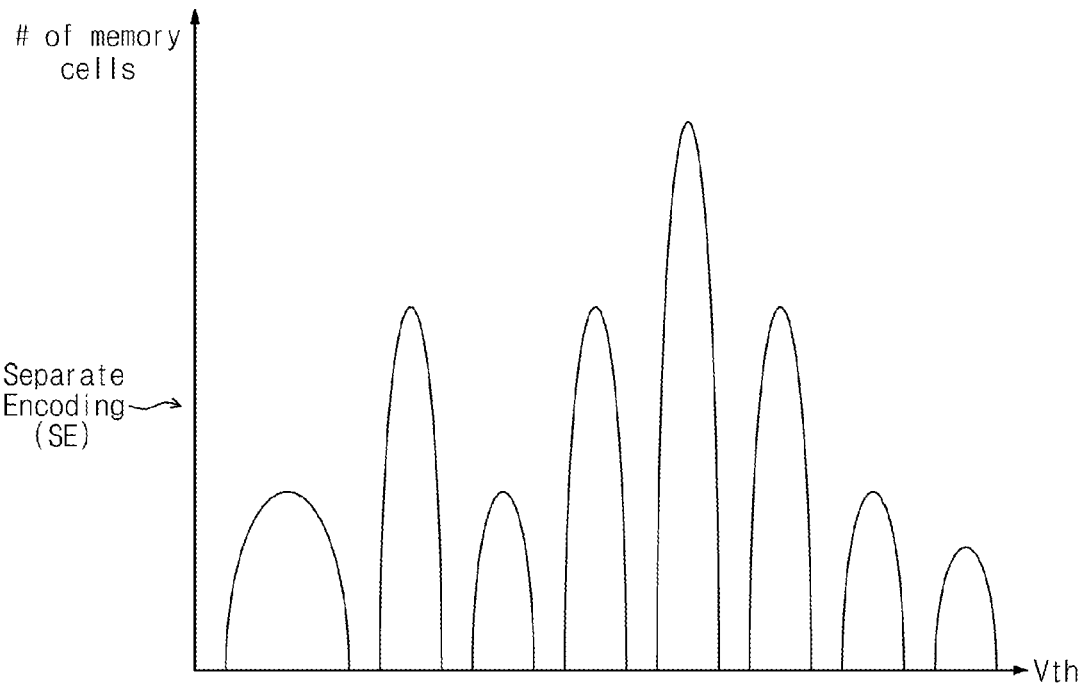

FIG. 13

| Start | Available Branches | Sub candidate Data |
|---|---|---|
| A1 | B11 (to A1) | Y1 |
|    | B12 (to A2) | Y2 |
| A2 | B23 (to A3) | Y3 |
|    | B24 (to A4) | Y4 |
| A3 | B31 (to A1) | Y5 |
|    | B32 (to A2) | Y6 |
| A4 | B43 (to A3) | Y7 |
|    | B44 (to A4) | Y8 |

STORAGE DEVICE AND OPERATING METHOD OF STORAGE DEVICE

CROSS-REFERENCE TO RELATED APPLICATIONS

A claim for priority under 35 U.S.C. §119 is made to Korean Patent Application No. 10-2014-0085334 filed Jul. 8, 2014, in the Korean Intellectual Property Office, the entire contents of which are hereby incorporated by reference.

BACKGROUND

1. Field

The inventive concepts described herein relate to a semiconductor memory device, and more particularly, relate to a storage device and an operating method thereof.

2. Related Art

A storage device is a device that stores data according to a control of a host device, such as a computer, a smart phone, a smart pad, and so on. The storage device may contain a device (e.g., Hard Disk Drive) in which data is stored on a magnetic disk or a semiconductor memory, such as Solid State Drive or memory card, in particular, a device in which data is stored in a nonvolatile memory.

A nonvolatile memory may be ROM (Read Only Memory), PROM (Programmable ROM), EPROM (Electrically Programmable ROM), EEPROM (Electrically Erasable and Programmable ROM), flash memory, PRAM (Phase-change RAM), MRAM (Magnetic RAM), RRAM (Resistive RAM), or FRAM (Ferroelectric RAM).

The advancement of the semiconductor fabrication technology enables high integration and high capacity of the storage device, thereby making it possible to reduce production costs of the storage device. However, various problems that have not been found may arise as the storage device is scaled down due to its high integration. Such problems cause loss of data stored in the storage device, thereby resulting in a decrease in reliability of the storage device. Accordingly, it may be desirable to improve the reliability of the storage device.

SUMMARY

According to at least one example embodiment of the inventive concepts, an operating method of a storage device which includes a nonvolatile memory including a plurality of memory cells; and a memory controller adapted to control the nonvolatile memory, may include receiving write data to be written at the plurality of memory cells; generating a determination by determining whether the received write data is least significant bit (LSB) data to be written at the plurality of memory cells; and encoding the write data according to the determination, wherein the write data is encoded according to the write data when the write data is LSB data to be written at the plurality of memory cells, and wherein the write data is encoded according to the write data and encoding data of lower data of the write data to be written at the plurality of memory cells when the write data is not LSB data to be written at the plurality of memory cells.

LSB data, central significant bit (CSB) data and most significant bit (MSB) data may be written at each of the plurality of memory cells, wherein data that is written as LSBs of data to be written at the plurality of memory cells and is first received is the LSB data, wherein data that is written as CSBs of data to be written at the plurality of memory cells and is received following the LSB data is the CSB data, wherein data that is written as MSBs of data to be written at the plurality of memory cells and is received following the CSB data is the MSB data, and wherein the CSB data is lower data of the MSB data, and the LSB data is lower data of the MSB data and CSB data.

Each of the plurality of memory cells may have one of at least first to eighth threshold voltage states according to LSB data, central significant bit (CSB) data, and most significant bit (MSB) data, and when the write data is the LSB data, the encoding the write data according to the determination may include decoding the LSB data such that a number of bits in the write data corresponding to an LSB value that is the same as an LSB value of a highest threshold voltage state is reduced, the highest threshold voltage state being a highest one of the at least first to eighth threshold voltage states.

When the write data is the CSB data, the operating method may further include detecting bits, from among the encoded LSB data, having a same value as the LSB value of the highest threshold voltage states, and the encoding the write data according to the determination may include encoding the CSB data is such that, with respect to first data, a number of bits in the first data corresponding to a CSB value that is the same as a CSB value of the highest threshold voltage state, is reduced, the first data being data, from among the write data, for which values of the encoded LSB data are the same as the LSB value of the highest threshold voltage state.

When the write data is the MSB data, the operating method may further include detecting bits, from among the encoded LSB data, having a same value as the LSB value of the highest threshold voltage states, detecting bits, from among the encoded CSB data, having a same value as the CSB value of the highest threshold voltage states, and the encoding the write data according to the determination may include encoding the MSB data such that, with respect to second data, a number of bits in the second data corresponding to a MSB value that is the same as a MSB value of the highest threshold voltage state, is reduced, the second data being data, from among the write data, for which values of the encoded LSB data are the same as the LSB value of the highest threshold voltage state and values of the encoded CSB data are the same as the CSB value of the highest threshold voltage state.

The encoding the write data according to the determination may include encoding the write data such that, a value of a first portion of the write data is changed according to either, the write data, or a combination of the write data and encoding data of the lower data, and a value of a second portion of the write data is changed according to the write data regardless of the encoding data of the lower data.

The encoding the write data according to the determination may include encoding the write data such that the write data is encoded according to encoding data of second data to be written at second memory cells adjacent to the plurality of memory cells.

The operating method may further include writing the encoded write data such that at least an LSB, a CSB, and an MSB are written at each of the plurality of memory cells and each of the second memory cells, wherein each of the plurality of memory cells and each of the second memory cells has one of the at least first to at least eight threshold voltage states, the at least first to at least eighth threshold voltage states each corresponding to values for an LSB, a CSB, and an MSB, wherein locations of bits, corresponding to a highest threshold voltage state, from among at least first through eighth threshold voltage states, are detected from the encoding data of the second data, and wherein the write data is encoded such that data corresponding to a lowest threshold voltage, from among the at the least first through eighth threshold voltage states, are not written in memory cells at the detected locations.

The write data may be first write data and the method may further include receiving first data; and dividing the first data into the first write data, second write data, and third write data, wherein the first write data is selected as the LSB data to be written at the plurality of memory cells as first bits, the second write data is selected as the CSB data to be written at the plurality of memory cells as second bits, and the third write data is selected as the MSB data to be written at the plurality of memory cells as third bits.

The nonvolatile memory may further include first latches, second latches, and third latches connected to the plurality of memory cells, respectively; second memory cells connected to a same word line as the plurality of memory cells; and fourth latches, fifth latches, and sixth latches connected to the second memory cells, respectively, wherein the operating method further includes, loading encoding data of the first write data on the first latches; loading encoding data of the second write data on the second latches; and loading encoding data of the third write data on the third latches.

The operating method may further include respectively loading next encoding data on the fourth latches, the fifth latches, and the sixth latches, and then, writing the data loaded on the first to sixth latches at the plurality of memory cells and the second memory cells.

According to at least one example embodiment of the inventive concepts, an operating method of a storage device which includes a nonvolatile memory including a plurality of memory cells; and a memory controller adapted to control the nonvolatile memory, may include receiving write data to be written, as a plurality of data units, to the plurality of memory cells, each of the plurality of data units corresponding to one of at least first through eighth threshold voltages, each of the at least first through eighth threshold voltages corresponding to a different one of a plurality of multi-bit data values, each of the multi-bit data values including a least significant bit (LSB), at least one central significant bit (CSB), and a most significant bit (MSB); dividing the write data based on significance of bits of the write data; encoding the write data by, encoding LSB data, from among the write data, encoding CSB data, from among the write data, based on LSB data corresponding to the CSB data, and encoding MSB data, from among the write data, based on LSB data and CSB data corresponding to the MSB data.

The encoding may include encoding the write data such that a number of data units, from among the plurality of data units, having a same multi-bit data value as a highest multi-bit data value is reduced, the highest multi-bit data value being the multi-bit data value, from among the plurality of multi-bit data values, to which a highest threshold voltage state corresponds, the highest threshold voltage state being a highest one of the at least first through eighth threshold voltage states.

The CSB data may include a first plurality of CSBs and a second plurality of CSBs, and the encoding may include encoding the CSB data such that, values of the first plurality of CSBs are changed based on, a combination of the first CSBs and bits of encoding data of the LSB data corresponding to the first CSBs, and values of the second plurality of CSBs are changed based on the second plurality of CSBs regardless of the encoding data of the LSB data.

The MSB data may include a first plurality of MSBs and a second plurality of MSBs, and the encoding may include encoding the MSB data such that, values of the first plurality of MSBs are changed based on, a combination of the first MSBs, bits of encoding data of the CSB data corresponding to the first MSBs, and bits of encoding data of the LSB data corresponding to the first MSBs, and values of the second plurality of MSBs are changed based on the second plurality of MSBs regardless of the encoding data of the LSB data and regardless of the encoding data of the CSB data.

Another aspect of at least some example embodiments of the inventive concepts is directed to provide a storage device comprising a nonvolatile memory including a plurality of memory cells connected in common to a word line and connected to a plurality of bit lines, respectively; and a memory controller adapted to control the nonvolatile memory, wherein the memory controller comprises a memory adapted to store write data and encoding data obtained by encoding the write data; and an encoder adapted to read the write data from the memory, encode the read write data to generate the encoding data, and store the encoding data at the memory, wherein when the write data is LSB data to be written at the plurality of memory cells as first bits, the encoder encodes the write data according to the write data, and wherein when the write data is not LSB data to be written at the plurality of memory cells as first bits, the encoder encodes the write data according to the write data and encoding data of lower data of the write data.

According to one or more example embodiments of the inventive concepts, the encoder comprises an inverse syndrome former adapted to calculate the write data and predetermined or, alternatively, reference values to generate first intermediate data; a Viterbi decoder adapted to output second intermediate data according to the write data and indicator information; an operator adapted to perform an exclusive OR operation on the first intermediate data and the second intermediate data to output the encoding data; and a calculator adapted to update the indicator information according to the encoding data.

According to one or more example embodiments of the inventive concepts, the indicator information includes indicator bits, each having a first value or a second value according to encoding data of lower data of the write data, each indicator bit corresponding to each memory cell has the first value when encoding data of lower data to be written at each memory cell corresponds to a highest threshold voltage state, and each indicator bit corresponding to each memory cell has the second value when the encoding data of the lower data to be written at each memory cell does not correspond to the highest threshold voltage state.

According to one or more example embodiments of the inventive concepts, the Viterbi decoder is adapted to compare a plurality of candidate data and the write data, and at least one of the plurality of candidate data is selected such that the number of bits, corresponding to the highest threshold voltage state, of bits of encoding data of the write data corresponding to indicator bits having the first bit decreases, the selected candidate data being output as the second intermediate data.

According to one or more example embodiments of the inventive concepts, the Viterbi decoder is adapted to output a first portion of the second intermediate data with respect to a first portion of the write data, using the indicator information and the write data, and the Viterbi decoder is further adapted to output the rest of the second intermediate data with respect to the rest of the write data, using the write data regardless of the indicator information.

According to one or more example embodiments of the inventive concepts, the Viterbi decoder is adapted to output the second intermediate data according to the write data, the indicator information, and second indicator information, the nonvolatile memory further comprises second memory cells connected in common to a second word line adjacent to the word line and connected to the plurality of bit lines, respectively, and the second indicator information includes indicator bits having a first value or a second value according to information of encoding data to be written at the second memory cells, and a second indicator bit corresponding to each of the second memory cells has the first value when data to be written at each of the second memory cell corresponds to the highest threshold voltage state. The second indicator bit corresponding to each of the second memory cells has the second value when data to be written at each of the second memory cell does not correspond to the highest threshold voltage state.

According to one or more example embodiments of the inventive concepts, the Viterbi decoder selects at least one of the plurality of candidate data such that there decreases the number of bits, corresponding to the highest threshold voltage state, from among bits of encoding data of the write data corresponding to the second indicator bits having the first value, the selected candidate data being output as the second intermediate data.

According to one or more example embodiments of the inventive concepts, the storage device further comprises a compression module adapted to compress the indicator information output from the encoder to store the compressed indicator information in the memory, read the compressed indicator information from the memory to decompress the compressed indicator information thus read, and transfers the decompressed result to the encoder.

Still another aspect of at least some example embodiments of the inventive concepts is directed to provide a storage device comprising a nonvolatile memory including a plurality of memory cells connected in common to a word line and connected to a plurality of bit lines, respectively; a memory adapted to store write data and encoding data obtained by encoding the write data; and a memory controller adapted to control the nonvolatile memory, wherein the memory controller includes an encoder adapted to read the write data from the memory, encode the read write data to generate the encoding data, and store the encoding data at the memory, wherein when the write data is LSB data to be written at each of the plurality of memory cells as a first bit, the encoder encodes the write data according to the write data, and wherein when the write data is not LSB data to be written at each of the plurality of memory cells as the first bit, the encoder encodes the write data according to the write data and encoding data of lower data of the write data.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIGS. 6 to 8 show variations in threshold voltage distributions of memory cells when LSB data, CSB data and MSB data are encoded;

FIG. 9 shows threshold voltage distributions of memory cells after referred encoding and separate encoding are performed;

FIG. 13 is a table schematically illustrating sub candidate data allocated to branches of each branch area;

DETAILED DESCRIPTION

Figure 1:
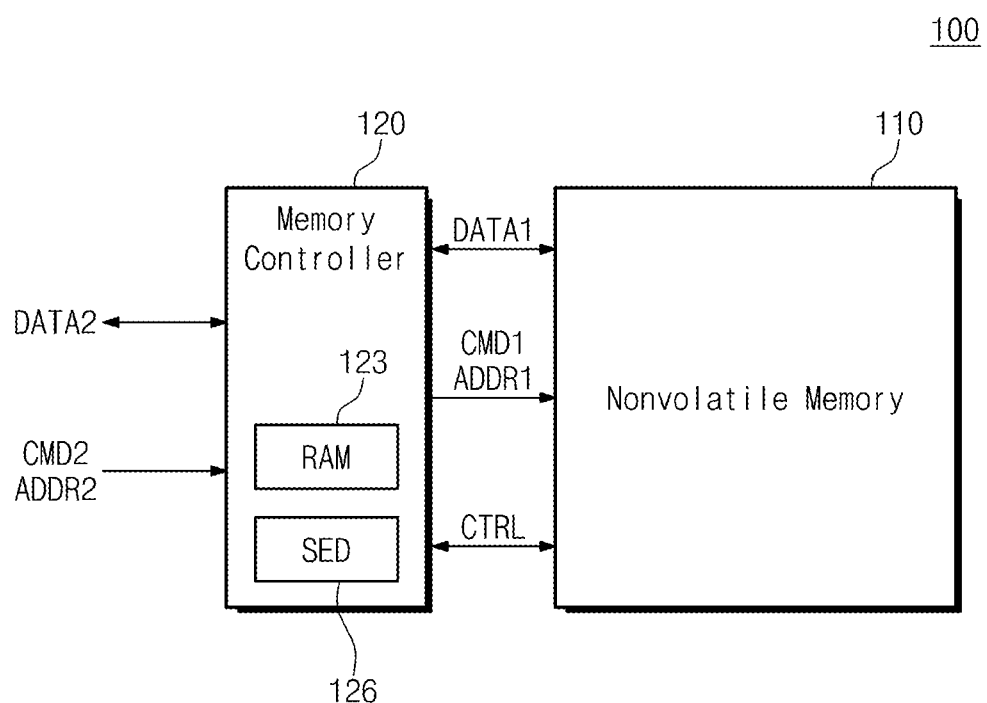
FIG. 1 is a block diagram schematically illustrating a storage device according to at least one example embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

FIG. 1 is a block diagram schematically illustrating a storage device 100 according to at least one example embodiment of the inventive concepts. Referring to FIG. 1, a storage device 100 contains a nonvolatile memory 110 and a memory controller 120.

The nonvolatile memory 110 performs read, write, and erase operations according to a control of the memory controller 120. The nonvolatile memory 110 exchanges first data DATA1 with the memory controller 120. For example, the nonvolatile memory 110 receives write data from the memory controller 120 and writes the write data. The nonvolatile memory 110 performs a read operation to output read data to the memory controller 120.

The nonvolatile memory 110 receives a first command CMD1 and a first address ADDR1 from the memory controller 120. The nonvolatile memory 110 exchanges a control signal CTRL with the memory controller 120. Examples of control signals CTRL include, for example, the nonvolatile memory 110 receives from the memory controller 120 at least one of a chip enable signal nCE for selecting at least one of a plurality of semiconductor chips constituting the nonvolatile memory 110, a command latch enable signal CLE indicating that a signal received from the memory controller 120 is the first command CMD1, an address latch enable signal ALE indicating that a signal received from the memory controller 120 is the first address ADDR1, a read enable signal nRE received from the memory controller 120 at a read operation and used to tune timing, a write enable signal nWE received from the memory controller 120 and used to tune timing for receiving the first command CMD1 or the first address ADDR1, and a data strobe signal DQS used to adjust input synchronization about the first data DATA1. For example, the nonvolatile memory 110 outputs to the memory controller 120 at least one of a ready/busy signal R/nB indicating whether the nonvolatile memory 110 performs a program, erase or read operation and a data strobe signal DQS used to adjust output synchronization about the first data DATA1.

The nonvolatile memory 110 may include a flash memory. However, example embodiments of the inventive concepts are not limited to this example. For example, the nonvolatile memory 110 may incorporate at least one of nonvolatile memories, such as PRAM (Phase-change RAM), MRAM (Magnetic RAM), RRAM (Resistive RAM), FeRAM (Ferroelectric RAM), and so on.

The memory controller 120 is configured to control the nonvolatile memory 110. For example, the memory controller 120 controls the nonvolatile memory 110 to perform a read, write, or erase operation. The memory controller 120 exchanges the first data DATA1 and the control signal CTRL with the nonvolatile memory 110 and outputs the first command CMD1 and the first address ADDR1 to the nonvolatile memory 110.

The memory controller 120 controls the nonvolatile memory 110 according to a control of an external host device (not shown). The memory controller 120 exchanges second data DATA2 with the host device and receives a second command CMD2 and a second address ADDR2.

The memory controller 120 encodes the second data DATA2 received from the host device and writes the encoded result at the nonvolatile memory 110 as the first data DATA1. The memory controller 120 decodes the first data DATA1 received from the nonvolatile memory 110 and outputs the decoded result to the host device as the second data DATA2. According to one or more example embodiments of the inventive concepts, the memory controller 120 exchanges the first data DATA1 with the nonvolatile memory 110 by a first unit, and it exchanges the second data DATA2 with the host device by a second unit different from the first unit.

The memory controller 120 exchanges the first data DATA1 with the nonvolatile memory 110 according to a first format and transmits the first command CMD1 and the first address ADDR1 to the nonvolatile memory 110. The memory controller 120 exchanges the second data DATA2 with the host device according to a second format different from the first format and receives the second command CMD2 and the second address ADDR2 from the host device.

The memory controller 120 contains a RAM 123 and a shape encoder and decoder block 126. The RAM 123 stores the second data DATA2 received from the host device. The RAM 123 stores the first data DATA1 the shape encoder and decoder block 126 encodes. The RAM 123 stores the first data DATA1 received from the nonvolatile memory 110. The RAM 123 stores the second data DATA2 that is obtained by decoding the first data DATA1. The RAM 123 acts as a working memory, a buffer memory, or a cache memory of the memory controller 120.

The shape encoder and decoder block 126 encodes the second data DATA2 stored in the RAM 123 and outputs them as the first data DATA1. The shape encoder and decoder block 126 decodes the first data DATA1 stored in the RAM 123 and outputs them as the second data DATA2.

That is, at a write operation, the shape encoder and decoder block 126 encodes the second data DATA2 received from the host device into the first data DATA1. The first data DATA1 is stored in the nonvolatile memory 110. At a read operation, the shape encoder and decoder block 126 decodes the first data DATA1 received from the nonvolatile memory 110 into the second data DATA2. Output to the host device is the second data DATA2. At a migration operation, the shape encoder and decoder block 126 decodes the first data DATA1 read from the nonvolatile memory 110 and encodes the decoded result. Afterwards, the encoded result is written back at the nonvolatile memory 110 as the first data DATA1. For example, the migration operation may mean an operation in which data stored in a first area of the nonvolatile memory 110 is moved into a second area of the nonvolatile memory 110. In at least some other embodiments of the inventive concepts, at the migration operation, the first data DATA1 read from the nonvolatile memory 110 is written back at the nonvolatile memory 110 without decoding and encoding.

The storage device 100 performs an operation of writing, reading or erasing data according to a request of the host device. The storage device 100 may include a solid state drive (SSD) or a hard disk drive (HDD). The storage device 100 may include memory cards, such as PC card (PCMCIA, personal computer memory card international association), compact flash card, smart media card (SM, SMC), memory stick, multimedia card (MMC, RS-MMC, MMCmicro), SD card (SD, miniSD, microSD, SDHC), USB (Universal Serial Bus) memory card, universal flash storage (UFS), and so on. The storage device 100 may include embedded memories, such as eMMC (embedded MultiMedia Card), UFS, PPN (Perfect Page New), and so on.

Figure 2:
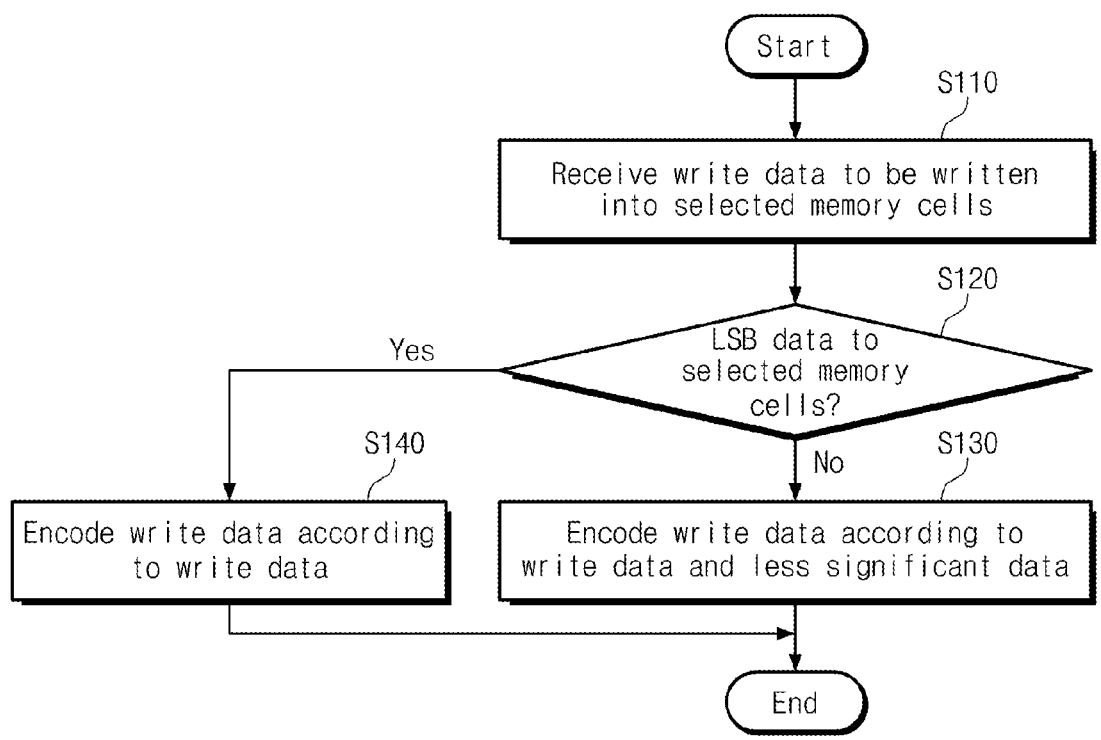
FIG. 2 is a flow chart schematically illustrating an operating method of a storage device according to at least one example embodiment of the inventive concepts.

FIG. 2 is a flow chart schematically illustrating an operating method of a storage device 100 according to at least one example embodiment of the inventive concepts. Referring to FIGS. 1 and 2, in step S110, a storage device 100 receives write data to be written at selected memory cells of a nonvolatile memory 110. The write data may be stored in a RAM 123 of a memory controller 120.

In step S120, the storage device 100 determines whether the write data is data that is first to be written at the selected memory cells. For example, the memory controller 120 may determine whether the write data is data that is to be written at selected memory cells of a selected memory block as least significant bit (LSB) data.

As a consequence of determining that the write data is LSB data, in step S140, the storage device 100 encodes the write data according to the write data. For example, a shape encoder and decoder block 126 reads write data stored in the RAM 123 and encodes the read write data only using the read write data.

As a consequence of determining that the write data is not LSB data, for example, if the write data is CSB (central significant bit) data or MSB (most significant bit) data, the method proceeds to step S130.

In step S130, the storage device 100 encodes the write data according to the write data to be written at the selected memory cells and lower data to be written or already written at the selected memory cells. For example, in step S130, the shape encoder and decoder block 126 may read encoding data, obtained by encoding the lower data of the write data, and the write data from the RAM 123, and it encodes the write data using the encoding data of the lower data and the write data.

According to one or more example embodiments of the inventive concepts, each memory cell of a nonvolatile memory 110 may store a plurality of bits. A first bit written at each memory cell may be LSB. The last bit written at each memory cell may be MSB. In each memory cell, one or more bits written between LSB and MSB may be CSB.

CSB data and LSB data may be less significant data of MSB data. LSB data may be lower data of CSB data. MSB data may be upper data of CSB and LSB data. CSB data may be upper data of LSB data.

When 4-bit data is written at each memory cell, the CSB may include first CSB and second CSB. The first CSB may be a second bit written at each memory cell. The second CSB may be a third bit written at each memory cell. In this case, the MSB may be a fourth bit written at each memory cell. Data that is written at each of a plurality of memory cells as the first CSB may be first CSB data. Data that is written at each of the plurality of memory cells as the second CSB may be second CSB data. The first CSB data may be lower data of the second CSB data. The second CSB data may be upper data of the first CSB data.

For the sake of easy understanding, at least some example embodiments of the inventive concepts will be explained with reference to a scenario in which CSB data corresponds to one bit written at each of a plurality of memory cells. However, example embodiments of the inventive concepts are not limited to this example. For example, at least some example embodiments of the inventive concepts are applicable to the case where CSB data corresponds to two or more bits written at each memory cells.

Figure 3:
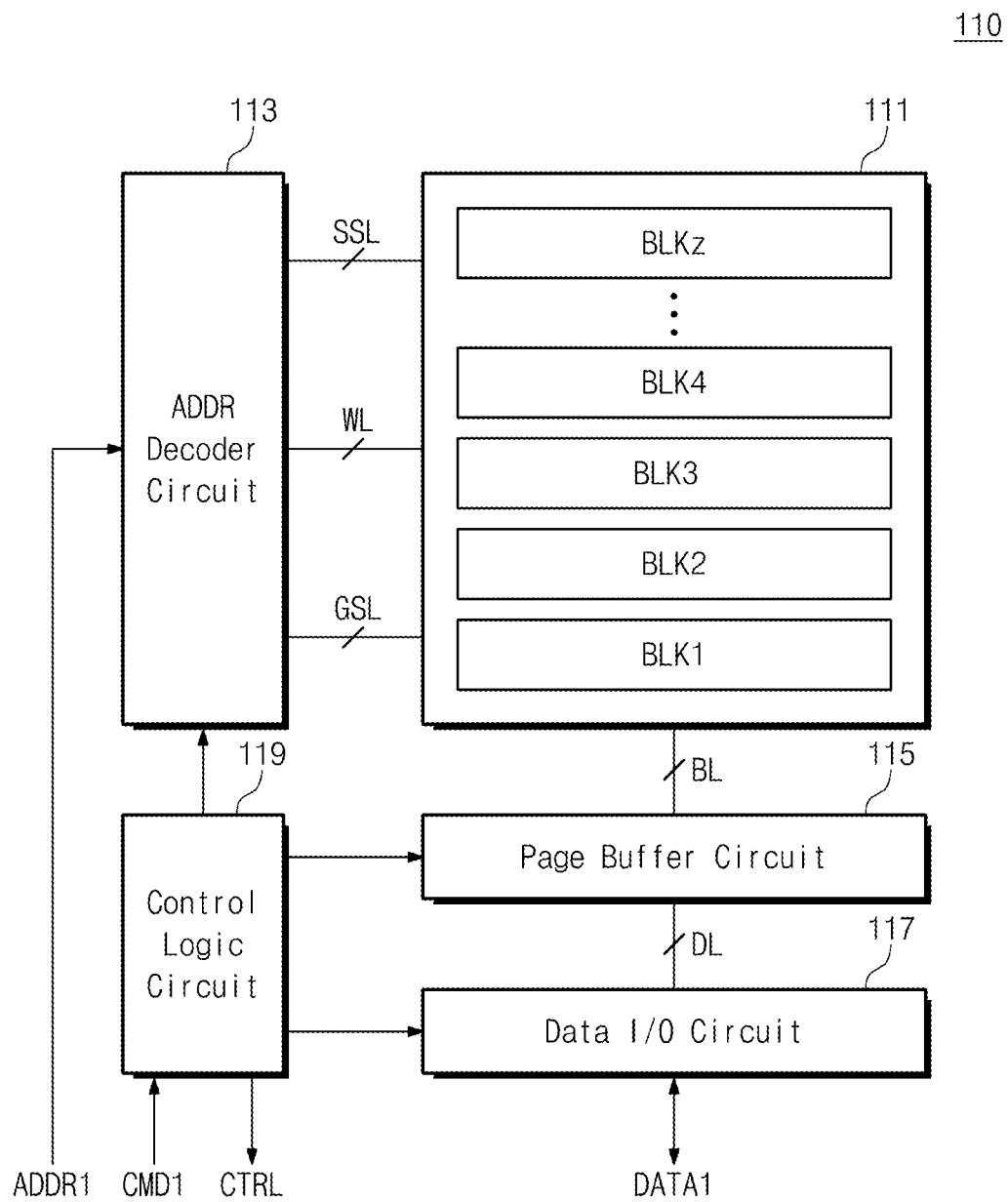
FIG. 3 is a block diagram schematically illustrating a nonvolatile memory according to at least one example embodiment of the inventive concepts.

FIG. 3 is a block diagram schematically illustrating a nonvolatile memory 110 according to at least one example embodiment of the inventive concepts. Referring to FIG. 3, a nonvolatile memory 110 includes a memory cell array 111, an address decoder circuit 113, a page buffer circuit 115, a data input/output circuit 117, and a control logic circuit 119.

The memory cell array 111 includes a plurality of memory blocks BLK1 to BLKz, each of which has a plurality of memory cells. Each memory block is connected to the address decoder circuit 113 through at least one string selection line SSL, a plurality of word lines WL, and at least one ground selection line GSL. Each memory block is connected to the page buffer circuit 115 through a plurality of bit lines BL. The memory blocks BLK1 to BLKz may be connected in common to the plurality of bit lines BL. Memory cells of the memory blocks BLK1 to BLKz may have the same structure.

The address decoder circuit 113 is connected to the memory cell array 111 through a plurality of ground selection lines GSL, the plurality of word lines WL, and a plurality of string selection lines SSL. The address decoder circuit 113 operates in response to a control of the control logic circuit 119. The address decoder circuit 113 receives a first address ADDR1 from a memory controller 120. The address decoder circuit 113 decodes the first address ADDR1 and controls voltages to be applied to the word lines WL according to the decoded address.

For example, at programming, the address decoder circuit 113 applies a program voltage to a selected word line of a selected memory block that the first address ADDR1 points at. The address decoder circuit 113 also applies a pass voltage to unselected word lines of the selected memory block. At reading, the address decoder circuit 113 applies a selection read voltage to a selected word line of a selected memory block that the first address ADDR1 points at. The address decoder circuit 113 also applies a non-selection read voltage to unselected word lines of the selected memory block. At erasing, the address decoder circuit 113 applies an erase voltage (e.g., ground voltage) to word lines of a selected memory block that the first address ADDR1 points at.

The page buffer circuit 115 is connected to the memory cell array 111 through the bit lines BL. The page buffer circuit 115 is connected to the data input/output circuit 117 through a plurality of data lines DL. The page buffer circuit 115 operates in response to a control of the control logic circuit 119.

The page buffer circuit 115 holds data to be programmed at memory cells of the memory cell array 111 or data read from memory cells thereof. During a program operation, the page buffer circuit 115 stores data to be stored in memory cells. The page buffer circuit 115 biases the plurality of bit lines BL based on the stored data. The page buffer circuit 115 functions as a write driver at a program operation. During a read operation, the page buffer circuit 115 senses voltages of the bit lines BL and stores the sensed results. The page buffer circuit 115 functions as a sense amplifier at a read operation.

The data input/output circuit 117 is connected to the page buffer circuit 115 through the data lines DL. The data input/output circuit 117 exchanges first data DATA1 with the memory controller 120.

The data input/output circuit 117 temporarily stores first data DATA1 the memory controller 120 provides, and it transfers the temporarily stored data to the page buffer circuit 115. The data input/output circuit 117 temporarily stores data transferred from the page buffer circuit 115 and transfers it to the memory controller 120. The data input/output circuit 117 functions as a buffer memory.

The control logic circuit 119 receives a first command CMD1 and a control signal CTRL from the memory controller 120. The control logic circuit 119 decodes the first command CMD1 thus received and controls an overall operation of the nonvolatile memory 110 according to the decoded command.

Figure 4:
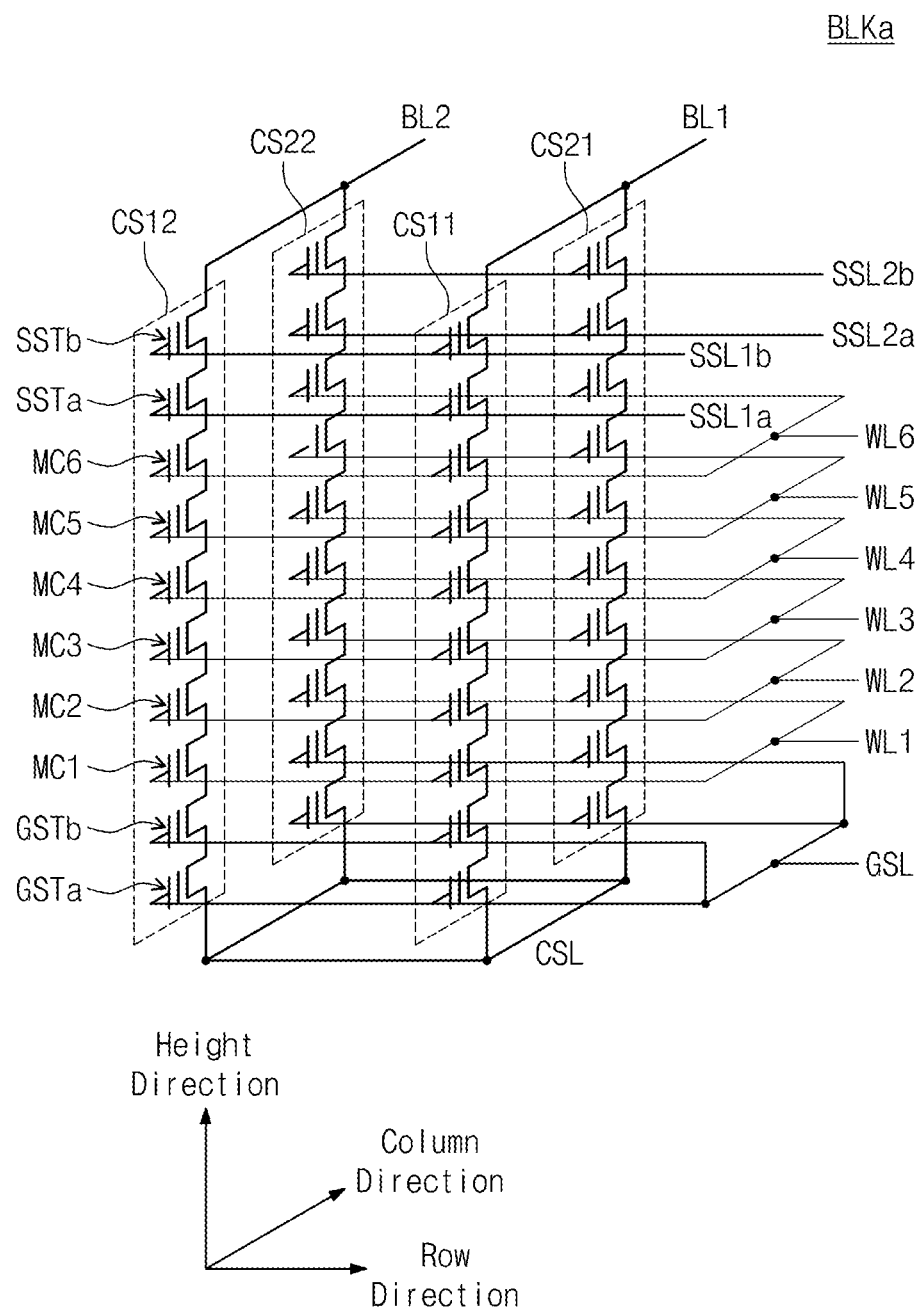
FIG. 4 is a circuit diagram schematically illustrating a memory block according to at least one example embodiment of the inventive concepts.

FIG. 4 is a circuit diagram schematically illustrating a memory block BLKa according to at least one example embodiment of the inventive concepts. Referring to FIG. 4, a memory block BLKa includes a plurality of cell strings CS11 to CS21 and CS12 to CS22. The plurality of cell strings CS11 to CS21 and CS12 to CS22 are arranged along a row direction and a column direction and form rows and columns.

For example, the cell strings CS11 and CS12 arranged along the row direction form a first row, and the cell strings CS21 and CS22 arranged along the row direction form a second row. The cell strings CS11 and CS21 arranged along the column direction form a first column, and the cell strings CS12 and CS22 arranged along the column direction form a second column.

Each cell string contains a plurality of cell transistors. The cell transistors include ground selection transistors GSTa and GSTb, memory cells MC1 to MC6, and string selection transistors SSTa and SSTb. The ground selection transistors GSTa and GSTb, memory cells MC1 to MC6, and string selection transistors SSTa and SSTb of each cell string are stacked in a height direction perpendicular to a plane (e.g., plane above a substrate of the memory block BLKb) on which the cell strings CS11 to CS21 and CS12 to CS22 are arranged along rows and columns.

Each cell transistor may be formed of a charge trap type cell transistor of which the threshold voltage varies with the amount of charge trapped in its insulation layer.

Lowermost ground selection transistors GSTa are connected in common to a common source line CSL.

The ground selection transistors GSTa and GSTb of the plurality of cell strings CS11 to CS21 and CS12 to CS22 are connected in common to a ground selection line GSL.

According to one or more example embodiments of the inventive concepts, ground selection transistors with the same height (or, order) may be connected to the same ground selection line, and ground selection transistors with different heights (or, orders) may be connected to different ground selection lines. For example, the ground selection transistors GSTa with a first height are connected in common to a first ground selection line, and the ground selection transistors GSTb with a second height are connected in common to a second ground selection line.

According to one or more example embodiments of the inventive concepts, ground selection transistors in the same row may be connected to the same ground selection line, and ground selection transistors in different rows may be connected to different ground selection lines. For example, the ground selection transistors GSTa and GSTb of the cell strings CS11 and CS12 in the first row are connected in common to the first ground selection line, and the ground selection transistors GSTa and GSTb of the cell strings CS21 and CS22 in the second row are connected in common to the second ground selection line.

Connected in common to a word line are memory cells that are placed at the same height (or, order) from the substrate (or, the ground selection transistors GST). Connected to different word lines WL1 to WL6 are memory cells that are placed at different heights (or, orders). For example, the memory cells MC1 are connected in common to the word line WL1, the memory cells MC2 are connected in common to the word line WL2, and the memory cells MC3 are connected in common to the word line WL3. The memory cells MC4 are connected in common to the word line WL4, the memory cells MC5 are connected in common to the word line WL5, and the memory cells MC6 are connected in common to the word line WL6.

In first string selection transistors SSTa, having the same height (or, order), of the cell strings CS11 to CS21 and CS12 to CS22, the first string selection transistors SSTa in different rows are connected to different string selection lines SSL1a and SSL2a. For example, the first string selection transistors SSTa of the cell strings CS11 and CS12 are connected in common to the string selection line SSL1a, and the first string selection transistors SSTa of the cell strings CS21 and CS22 are connected in common to the string selection line SSL2a.

In second string selection transistors SSTb, having the same height (or, order), of the cell strings CS11 to CS21 and CS12 to CS22, the second string selection transistors SSTb in different rows are connected to the different string selection lines SSL1a and SSL2a. For example, the second string selection transistors SSTb of the cell strings CS11 and CS12 are connected in common to the string selection line SSL1b, and the second string selection transistors SSTb of the cell strings CS21 and CS22 are connected in common to the string selection line SSL2b.

That is, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

According to one or more example embodiments of the inventive concepts, string selection transistors of cell strings in the same row may be connected in common to a string selection line. For example, string selection transistors SSTa and SSTb of cell strings CS11 and CS12 in the first row are connected in common to a string selection line, and string selection transistors SSTa and SSTb of cell strings CS21 and CS22 in the second row are connected in common to a string selection line.

Columns of the cell strings CS11 to CS21 and CS12 to CS22 are connected to different bit lines BL1 and BL2, respectively. For example, string selection transistors SSTb of the cell strings CS11 and CS21 in the first column are connected in common to the bit line BL1, and string selection transistors SSTb of the cell strings CS12 and CS22 in the second column are connected in common to the bit line BL2.

The cell strings CS11 and CS12 form a first plane and the cell strings CS21 and CS22 form a second plane.

A write and a read operation of the memory block BLKa may be performed by the row. For example, selected by the string selection lines SSL1a, SSL1b, SSL2a, and SSL2b is one plane. Connected to the bit lines BL1 and BL2 are cell strings CS11 and CS12 of the first plane when a turn-on voltage is applied to the string selection lines SSL1a and SSL1b and a turn-off voltage is supplied to the string selection lines SSL2a and SSL2b. That is, the first plane is selected. Connected to the bit lines BL1 and BL2 are cell strings CS21 and CS22 of the second plane when a turn-on voltage is applied to the string selection lines SSL2a and SSL2b and a turn-off voltage is supplied to the string selection lines SSL1a and SSL1b. That is, the second plane is selected. In a selected plane, a row of memory cells may be selected by word lines WL1 to WL6. A read or a write operation may be performed with respect to the selected row.

An erase operation on the memory block BLKa may be performed by the block or by the sub block. All of memory cells of a memory block BLKa may be erased when the erase operation is performed by the memory block. The erase operation being performed by the sub block, a part of memory cells of the memory block BLKa may be erased and the rest thereof may be erase-inhibited. A low voltage (e.g., ground voltage) is supplied to a word line connected to memory cells to be erased; a word line connected to memory cells to be erase-inhibited is floated.

The memory block BLKa shown in FIG. 4 is an example. However, example embodiments of the inventive concepts are not limited to the example shown in FIG. 4. For example, the number of rows of cell strings may increase or decrease. As the number of rows of cell strings is changed, the number of string or ground selection lines and the number of cell strings connected to a bit line may also be changed.

The number of columns of cell strings may increase or decrease. As the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string further includes at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 5:
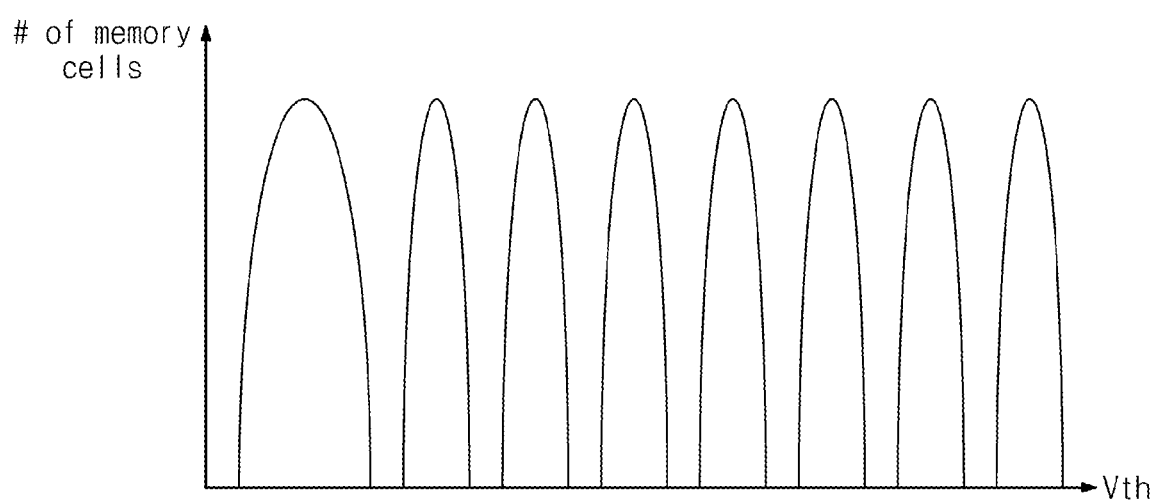
FIG. 5 shows program states of memory cells MC of a memory block illustrated in FIG. 4.

FIG. 5 shows program states of memory cells MC of a memory block BLKa illustrated in FIG. 4. In FIG. 5, the abscissa indicates a threshold voltage and the ordinate indicates the number of memory cells.

Referring to FIG. 5, LSB, CSB, and MSB are written at each memory cell, for example. A state of each memory cell may depend on LSB, CSB, and MSB values written at each memory cell. Since eight combinations of LSB, CSB, and MSB are possible, a memory cell at which LSB, CSB, and MSB are written has one of eight states S1 to S8.

Storing LSB of 1, CSB of 1, and MSB of 1, a memory cell has the first state S1. Memory cells having the first state S1 form the lowest range of threshold voltage distribution.

Storing LSB of 0, CSB of 1, and MSB of 1, a memory cell has the second state S2. Memory cells of the second state S2 form a range of threshold voltage distribution higher than the range of threshold voltage distribution of the first state S1.

A memory cell has the third state S3 when storing LSB of 0, CSB of 0, and MSB of 1. Memory cells of the third state S3 form a range of threshold voltage distribution higher than the range of threshold voltage distribution of the second state S2.

Storing LSB of 0, CSB of 0, and MSB of 0, a memory cell has the fourth state S4. Memory cells of the fourth state S4 form a range of threshold voltage distribution higher than the range of threshold voltage distribution of the third state S3

A memory cell has the fifth state S5 when storing LSB of 0, CSB of 1, and MSB of 0. Memory cells of the fifth state S4 form a range of threshold voltage distribution higher than the range of threshold voltage distribution of the fourth state S4.

A memory cell that has LSB of 1, CSB of 1, and MSB of 0 has the sixth state S6. Memory cells of the sixth state S6 form a range of threshold voltage distribution higher than the range of threshold voltage distribution of the fifth state S5.

If storing LSB of 1, CSB of 0, and MSB of 0, a memory cell has the seventh state S7. Memory cells of the seventh state S7 form a range of threshold voltage distribution higher than the range of threshold voltage distribution of the sixth state S6

A memory cell has the eighth state S8 when storing LSB of 1, CSB of 0, and MSB of 1. Memory cells of the eighth state S8 form a range of threshold voltage distribution higher than the range of threshold voltage distribution of the seventh state S7.

The bit ordering shown in FIG. 5 is an example. However, example embodiments of the inventive concepts are not limited to the example shown in FIG. 5. Change or modification on the bit ordering may be variously made.

The eighth state S8 has the highest range of threshold voltage distribution. For example, threshold voltages of memory cells of the eighth state S8 are higher than those of memory cells of the first to seventh states S1 to S7. If memory cells of the first to seventh states S1 to S7 are placed near memory cells of the eighth state S8, an electric field is generated due to a difference between threshold voltages of memory cells of the eighth state S8 and threshold voltages of memory cells of the first to seventh states S1 to S7. Now that a difference between a threshold voltage of a memory cell of the eighth state S8 and a threshold voltage of a memory cell of the first state S1 is greatest, the strongest electric field is generated between the memory cell of the eighth state S8 and the memory cell of the first state S1. The electric field causes a decrease in a threshold voltage of the memory cell of the eighth state S8 or increase in a threshold voltage of the memory cell of the first state S1, thereby causing damage of data written at the memory cell.

In FIG. 5, at least one example embodiment of the inventive concepts is explained with reference to an example in which three bits (e.g., the LSB, CSB, and MSB) are written at each memory cell. If four or more bits are written at each memory cell, a voltage difference between the lowest threshold voltage distribution and the highest threshold voltage distribution may become greater as compared to the case illustrated in FIG. 5. In this case, a stronger electric field is generated, so the probability that data written at each memory cell is damaged becomes higher.

To prevent the above-described problem, a shape encoder and decoder block 126 according to at least one example embodiment of the inventive concepts encodes write data in such a way that the amount of data corresponding to the eighth state S8 decreases.

Figure 6:
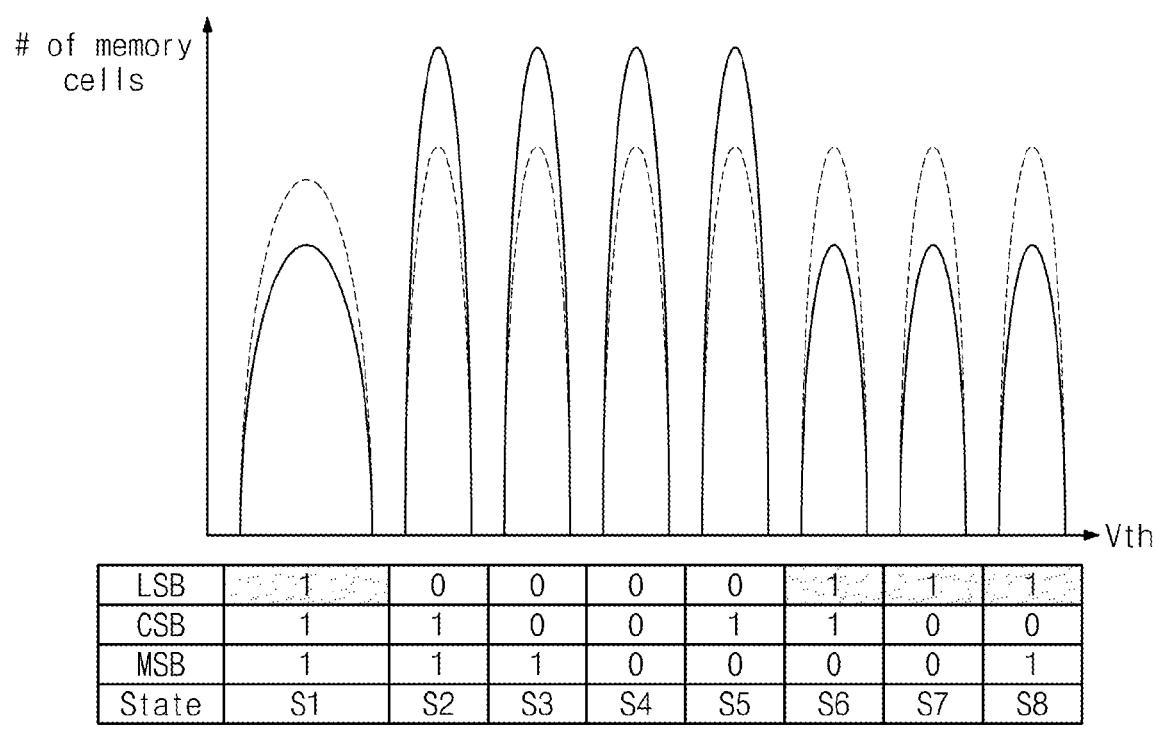

FIGS. 6 to 8 show variations in threshold voltage distributions of memory cells when LSB data, CSB data and MSB data are encoded. In FIGS. 6 to 8, the abscissa indicates a threshold voltage and the ordinate indicates the number of memory cells.

Referring to FIG. 6, as LSB data to be written at memory cells, write data is encoded in such a way that there is a decrease in the number of bits corresponding to LSB value that the highest state, for example the eighth state S8, has. For example, in FIG. 6, the LSB of the eighth state S8 (i.e., the highest state) is '1'. Accordingly, write data is encoded in such a way that the number of bits each corresponding to an LSB value of the eighth state S8 (i.e., '1' in the example shown in FIG. 6) decreases. Consequently, the write data is encoded such that the number of program states corresponding to an LSB of '1' is reduced. For example, a portion of '1' bits of the write data may be changed into a '0' bit thus reducing the number of '1' bits in the LSB data of the write data.

In the example shown in FIG. 5, each of the first, sixth, seventh, and eighth states S1, S6, S7, and S8 has an LSB value of 1. If the write data is converted in such a way that the number of '1' bits decreases, the number of memory cells having the first, sixth, seventh, and eighth states S1, S6, S7, and S8 decreases. The number of memory cells having the second to fifth states S2 to S5 also increases because the number of '0' bits of the write data increases.

In FIG. 6, dotted lines indicate threshold voltage distributions of memory cells before the LSB data is encoded, and solid lines indicate threshold voltage distributions of memory cells after the LSB data is encoded.

Referring to FIG. 7, as CSB data to be written at memory cells, write data is encoded such that the number of bits each corresponding to a CSB value of the eighth state S8 decreases.

For example, referred encoding RE or separate encoding SE may be performed with respect to write data. The referred encoding RE is encoding that is performed referring to both write data and encoding data of lower data of the write data. The separate encoding SE is encoding that is performed only referring to the write data without referring the lower data.

For example, in memory cells, as the write data is the CSB data, LSB data is the lower data of the write data. In case of the referred encoding RE, there are detected bits, having an LSB value of the eighth state S8 (highest state), from among LSB data (e.g., encoded data) to be written (or, written) at memory cells. The write data is encoded in such a way that there is a decrease in the number of bits corresponding to the detected bits and to a CSB value of the eighth state S8, from among the write data. For example, in FIG. 6, the CSB of the eighth state S8 (i.e., the highest state) is '0'. Accordingly, write data is encoded in such a way that the number of bits corresponding to the detected bits and to '0' of a CSB value of the eighth state S8, from among the write data, decreases. For example, encoding is made in such a way that, with respect to write data for which the LSB is '1', the number of CSBs having the value of '0' in such data is decreased.

Among the first to eighth states S1 to S8, the first state S1 and the sixth to eighth states S6 to S8 are states of which the LSB values are the same as an LSB value of the highest state, that is, the eighth state S8. Among the first state S1 and the sixth to eighth states S6 to S8, the seventh and eighth states S7 and S8 are states of which the CSB values are the same as a CSB value of the eighth state S8. Thus, the number of memory cells of the seventh and eighth states S7 and S8 decreases, and the number of memory cells of the first to sixth states S1 to S6 increases.

Referring to the referred encoding RE shown in FIG. 7, dotted lines indicate threshold voltage distributions of memory cells after LSB data is encoded and before CSB data is encoded, and solid lines indicate threshold voltage distributions of memory cells after both LSB data and CSB data are encoded.

In the separate encoding SE, as the CSB data, the write data is encoded in such a way that the number of bits each corresponding to a CSB value of the eighth state S8 decreases (i.e., '0' in the example shown in FIG. 7). Consequently, the write data is encoded such that the number of program states corresponding to a CSB of '0' is reduced. For example, the write data is encoded in such a way that the number of bits each corresponding to '0' of a CSB value of the eighth state S8 decreases.

CSB values of the third, fourth, seventh, and eighth states S3, S4, S7, and S8 are the same as '0' being a CSB value of the eighth state S8. Thus, the number of memory cells of the third, fourth, seventh, and eighth states S3, S4, S7, and S8 decreases, and the number of memory cells of the first, second, fifth, and sixth states S1, S2, S5, and S6 increases.

Referring to the separated encoding SE shown in FIG. 7, dotted lines indicate threshold voltage distributions of memory cells after LSB data is encoded and before the CSB data is encoded, and solid lines indicate threshold voltage distributions of memory cells after both the LSB data and the CSB data are encoded.

Referring to FIG. 8, as MSB data to be written at memory cells, write data is encoded such that the number of bits each corresponding to an MSB value of the eighth state S8 (i.e., '1' in the example shown in FIG. 8) decreases.

For example, referred encoding RE or separate encoding SE may be performed with respect to the write data. The referred encoding RE is encoding that is performed referring to both the write data and encoding data of lower data of the write data. The separate encoding SE is encoding that is performed only referring to the write data without referring the lower data.

For example, in memory cells, when the write data is MSB data, LSB data and CSB data are lower data of the write data being the MSB data. In case of the referred encoding RE, there are detected bits, having an LSB value and a CSB value of the eighth state S8 (highest state), from among the LSB data (e.g., encoded data) and the CSB data (e.g., encoded data) to be written (or, written) at memory cells. For example, locations (e.g., locations of memory cells) are detected where bits, corresponding to an LSB value of the eighth state S8, of the LSB data (e.g., encoded data) are written and bits, corresponding to an CSB value of the eighth state S8, of the CSB data (e.g., encoded data) are written. The write data is encoded in such a way that the number of bits, corresponding to the detected locations and to a MSB value of the eighth state S8, from among the write data decreases. For example, write data is encoded in such a way that the number of bits, corresponding to the detected locations and to '1' of an MSB value of the eighth state S8, from among the write data decreases. For example, data is encoded in such a way that, with respect to write data for which the LSB is '1' and the CSB is '0', the number of MSBs having the value of '1' is decreased.

Among the first to eighth states S1 to S8, the seventh and eighth states S7 and S8 are states of which the LSB and CSB values are the same as an LSB value of the highest state (i.e., the eighth state S8). The seventh state S7 does not have the same MSB value as the eighth state S8. Thus, the write data is encoded is such a way that the number of memory cells of the eighth state S8 decreases, and the number of memory cells of the first to seventh states S1 to S7 increases.

Referring to the referred encoding RE shown in FIG. 8, dotted lines indicate threshold voltage distributions of memory cells after the LSB data and the CSB data are encoded and before the MSB data is encoded, and solid lines indicate threshold voltage distributions of memory cells after both the LSB data, the CSB data, and the MSB data all are encoded.

In the separate encoding SE, as the MSB data, the write data is encoded in such a way that the number of bits each corresponding to an MSB value of the eighth state S8 decreases (i.e., '1' in the example shown in FIG. 8). Consequently, the write data is encoded such that the number of program states corresponding to a MSB of '1' is reduced. For example, write data is encoded in such a way that the number of bits each corresponding to '1' of an MSB value of the eighth state S8 decreases.

MSB values of the first to third and eighth states S1 to S3 and S8 are the same as '1' being an MSB value of the eighth state S8. Thus, the number of memory cells of the first to third and eighth states S1 to S3 and S8 decreases, and the number of memory cells of the fourth to seventh states S4 to S7 increases.

Referring to the separated encoding SE shown in FIG. 8, dotted lines indicate threshold voltage distributions of memory cells after the LSB data and the CSB data are encoded and before the MSB data is encoded, and solid lines indicate threshold voltage distributions of memory cells after the LSB data, the CSB data, and the MSB data all are encoded.

FIG. 9 shows threshold voltage distributions of memory cells after referred encoding RE and separate encoding SE are performed. In FIG. 9, the abscissa indicates a threshold voltage, and the ordinate indicates the number of memory cells.

Referring to referred encoding RE and separate encoding SE, the number memory cells having, as program states, first to seventh states S1 to S7 varies with a decrease in the number of memory cells having, as program states, eighth states S8. Memory cells of the first to seventh states S1 to S7 experiencing the referred encoding RE are illustrated as being more leveled and/or smoother, compared to memory cells of the first to seventh states S1 to S7 experiencing the separate encoding SE, as is shown in FIG. 9. In case the separate encoding SE is performed, the number of memory cells having the fifth state S5 of which the value is opposite to that of the eighth state S8 may be more than the number of memory cells having the remaining states S1 to S4 and S6 to S8.

Rather than a first case that the number of memory cells belonging to the first to eighth states S1 to S8 is leveled, in a second case that the number of memory cells of a state (e.g., S8), which lower reliability of a storage device 100, decreases and the number of remaining states (e.g., S1 to S7) is leveled, thus improving reliability of data written at memory cells. Furthermore, rather than a third case that the number of memory cells belonging to the eighth state S8 decreases and remaining states (e.g., S1 to S7) is not leveled, in the second case, reliability of data written at memory cells is improved. Thus, if the referred encoding, formed based on lower data and write data, is used, reliability of data written at memory cells may be higher than when the separate encoding is used.

Figure 10:
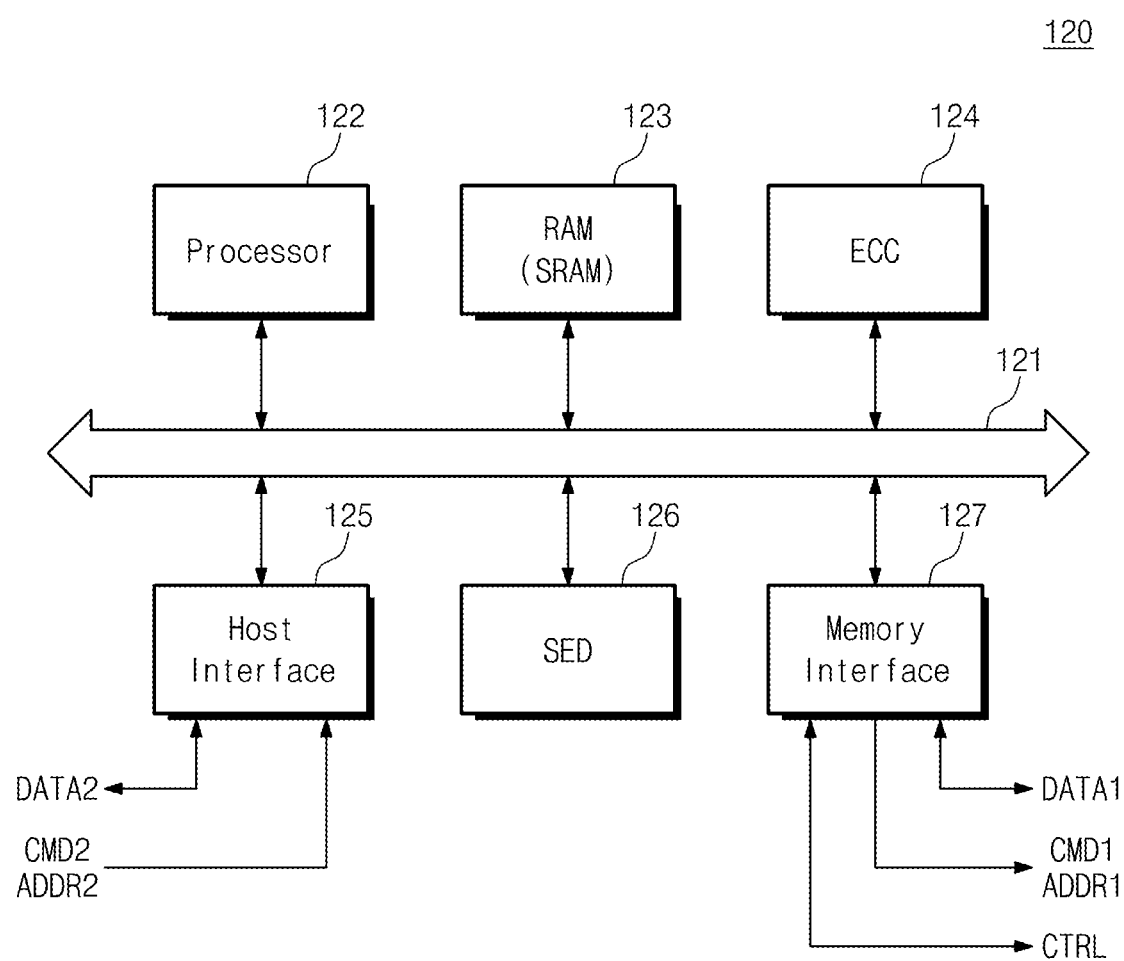
FIG. 10 is a block diagram schematically illustrating a memory controller according to at least one example embodiment of the inventive concepts.

FIG. 10 is a block diagram schematically illustrating a memory controller 120 according to at least one example embodiment of the inventive concepts. Referring to FIG. 10, a memory controller 120 contains a bus 121, a processor 122, a RAM 123, an ECC block 124, a host interface 125, a shape encoder and decoder (SED) block 126, and a memory interface 127.

The bus 121 may be configured to provide a channel among components of the memory controller 120.

The processor 122 controls an overall operation of the memory controller 120 and executes a logical operation. The processor 122 communicates with an external host through the host interface 125. The processor 122 receives a second command CMD2, and a second address ADDR2 through the host interface 125. The processor 122 exchanges second data DATA2 with an external host device through the host interface 125. The processor 122 exchanges first data DATA1 and a control signal CTRL with a nonvolatile memory 110 through the memory interface 127. The processor 122 outputs a first command CMD1 and a first address ADDR1 to the nonvolatile memory 110.

The term 'processor', as used herein, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multiprocessor, an application-specific integrated circuit (ASIC), and a field programmable gate array (FPGA).

The processor 122 stores the second command CMD2 or the second address received via the host interface 125 in the RAM 123. The processor 122 stores second data DATA2 received via the host interface 125 in the RAM 123. The processor 122 generates a first command CMD1 according to the second command CMD2 or the second address ADDR2 stored in the RAM 123 and outputs the first command CMD1 and a first address ADDR1 via the memory interface 127. The processor 122 outputs first data DATA1 stored in the RAM 123 via the memory interface 127. The processor 122 stores first data DATA1 received via the memory interface 127 in the RAM 123. The processor 122 may output second data DATA2 stored in the RAM 123. For example, the processor 122 may include a direct memory access (DMA) and may output data using the DMA.

According to one or more example embodiments of the inventive concepts, the RAM 123 is used as a work memory, a cache memory, or a buffer memory of the processor 122. The RAM 123 stores codes or instructions that the processor 122 will execute. The RAM 123 stores data processed by the processor 122. The RAM 123 may include an SRAM.

The ECC block 124 performs an error correction operation. The ECC block 124 generates parity for error correction based on data to be output to the memory interface 127. Data and parities may be output through the memory interface 127. The ECC block 124 corrects an error of data using data and parities that are received through the memory interface 127.

The host interface 125 communicates with the external host according to a control of the processor 122. The host interface 125 may communicate using at least one of various communication manners such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), eMMC (embedded MMC), and so on.

The shape encoder and decoder block 126 reads second data DATA2 stored in the RAM 123, encodes the second data DATA2 to generate first data DATA1, and stores the first data DATA1 in the RAM 123. The shape encoder and decoder block 126 reads first data DATA1 stored in the RAM 123, decodes the first data DATA1 to generate second data DATA2, and stores the second data DATA2 in the RAM 123. The shape encoder and decoder block 126 stores information needed to encode or decode data in the RAM 123 or read the information from the RAM 123. The shape encoder and decoder block 126 may be implemented with hardware or by software run by the processor 122.

The memory interface 127 is configured to communicate with a nonvolatile memory 110 according to a control of the processor 122.

According to one or more example embodiments of the inventive concepts, the processor 122 controls the memory controller 120 using codes. The processor 122 may load codes from a nonvolatile memory (e.g., read only memory) that is implemented in the memory controller 120. Or, the processor 122 may load codes received from the memory interface 127.

Figure 11:
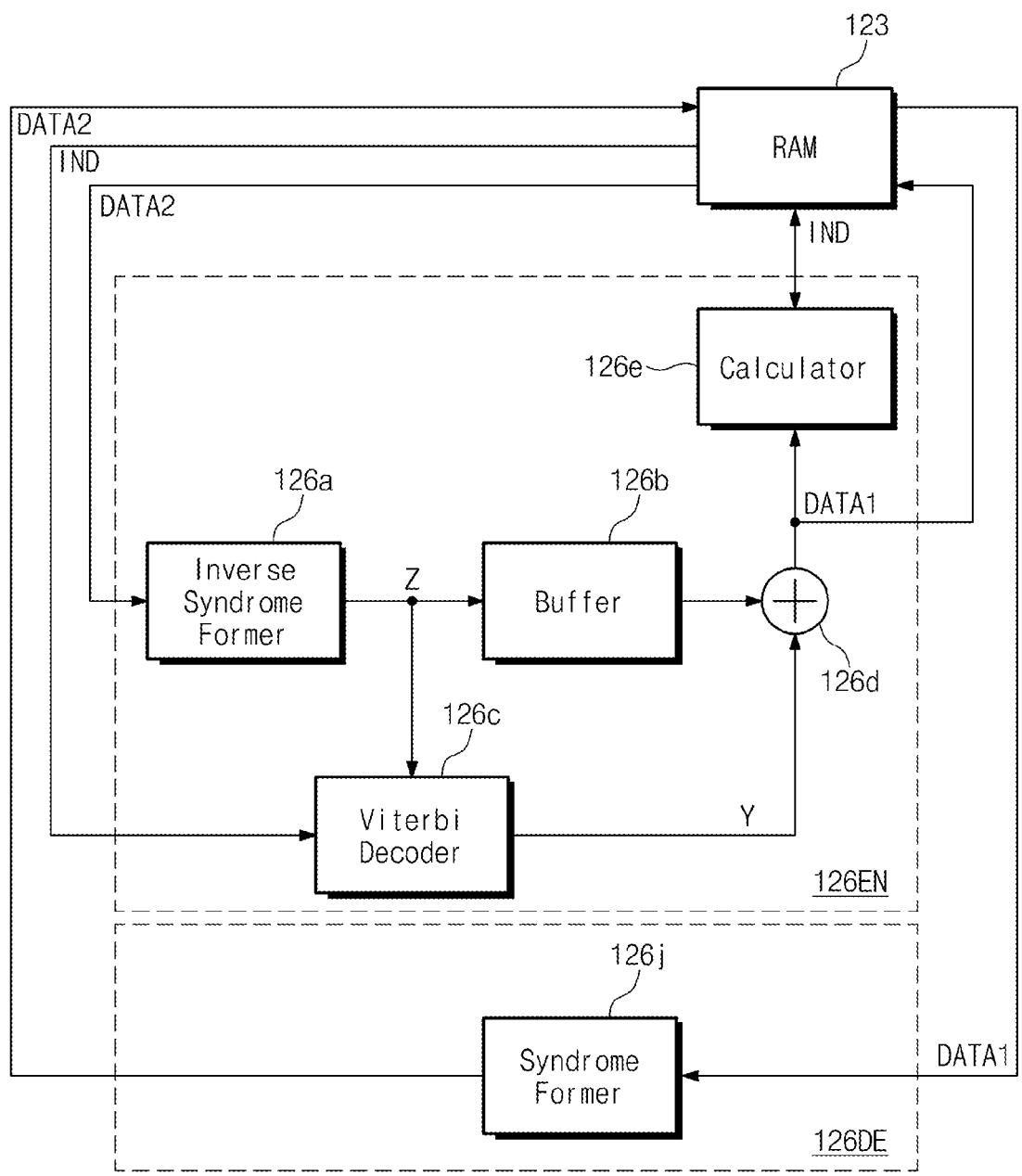
FIG. 11 is a block diagram schematically illustrating a shape encoder and decoder block and a RAM communicating with the shape encoder and decoder block, according to at least one example embodiment of the inventive concepts.

FIG. 11 is a block diagram schematically illustrating a shape encoder and decoder block 126 and a RAM 123 communicating with the shape encoder and decoder block 126, according to at least one example embodiment of the inventive concepts. Referring to FIGS. 1 and 11, a shape encoder and decoder block 126 contains an encoder 126EN and a decoder 126DE.

The encoder 126EN incorporates an inverse syndrome former 126a, a buffer 126b, a Viterbi decoder 126c, an operator 126d, and a calculator 126e.

The inverse syndrome former 126a receives second data DATA2 from a RAM 123. The second data DATA2 is data that is received from an external host device to be written at a nonvolatile memory 110. The second data DATA2 may be one of LSB data, CSB data and MSB data. The inverse syndrome former 126a calculates the second data DATA2 and an inverse parity check matrix $((H^{-1})^T)$ and outputs first intermediate data Z as the calculation result. The first intermediate data Z is calculated by the following equation (1).

$$Z = DATA2 \cdot (H^{-1})^T \qquad (1)$$

The first intermediate data Z is stored in the buffer 126b.

The Viterbi decoder 126c receives indicator information IND stored in the RAM 123. The indicator information IND has the same size as the second data DATA2. For example, the number of bits of the indicator information IND is equal to the number of bits of the second data DATA2.

The indicator information IND indicates locations, corresponding to the highest threshold voltage state S8, of encoding data of lower data of the second data DATA2: locations associated with memory cells at which the second data DATA2 is to be written. For example, when the second data DATA2 is LSB data, lower data does not exist. At this time, the indicator information IND is formed of '1' bits and indicates all locations.

When the second data DATA2 is CSB data, the indicator information IND is the same as LSB data.

For example, when the second data DATA2 is CSB data, the indicator information IND indicates locations of bits, having an LSB value of the highest threshold voltage state S8, of LSB data (e.g., encoded data) to be written (or already written) at memory cells where the second data DATA2 is to be written. For example, bits of the indicator information IND may have a first value (e.g., '1') at the same locations as bits of LSB data (e.g., encoded data) having a '1' value. Bits of the indicator information IND may have a second value (e.g., '0') at the same locations as bits of the LSB data (e.g., encoded data) having a '0' value.

When the second data DATA2 is MSB data, the indicator information IND has a value obtained by performing AND operation on inverse data of CSB data and LSB data.

For example, the indicator information IND indicates locations of bits, having LSB and CSB values of the highest threshold voltage state S8, of LSB and CSB data (e.g., encoded data) to be written (or already written) at memory cells where the second data DATA2 is to be written. For example, in a scenario where LSB and CSB values corresponding to a highest state (e.g., the eighth state S8) are '1' and '0', respectively, bits of the indicator information IND may have the first value at locations where locations of bits of LSB data (e.g., encoded data) having a '1' value and locations of bits of CSB data (e.g., encoded data) having a '0' value overlap. Bits of the indicator information IND may have the second value at locations where bits of the LSB data does not have a '1' value or bits of the CSB data does not have a '0' value.

The Viterbi decoder 126c further receives the first intermediate data Z. The Viterbi decoder 126c compares the first intermediate data Z and the indicator information IND and outputs second intermediate data Y according to the comparison result.

For example, the Viterbi decoder 126c generates a plurality of candidate data. The Viterbi decoder 126c selects one of the plurality of candidate data based on the first intermediate data Z: the selected candidate data experiences encoding in which there is a decrease in bits corresponding to a value of the highest threshold voltage state S8 and indicated by the indicator information IND.

For example, when the second data DATA2 is LSB data, the indicator information IND indicates all locations. At all locations of the second data DATA2, the Viterbi decoder 126c selects candidate data that experiences encoding in such a way that the number of bits corresponding to an LSB value of the highest threshold voltage state S8 is reduced or, alternatively, minimized. For example, the Viterbi decoder 126c selects candidate data that satisfies the following equation (2).

$$\wedge (Y, Z, IND) = \sum_{i=1}^{M} (Y_i \oplus Z_i) \& IND_I, \text{minimize'1'} \qquad (2)$$

In the equation (2), "i" indicates a bit location of each of the second intermediate data Y, the first intermediate data Z, and the indicator information IND. "M" indicates the number of bits of each of the second intermediate data Y, the first intermediate data Z, and the indicator information IND.

For example, selected as the second intermediate data Y is candidate data minimizing '1' from a result of an AND operation on each bit of the indicator information IND and an intermediate result of an exclusive-OR operation between each bit of the second intermediate data Y and each bit of the first intermediate data Z. That is, when each bit of the indicator information IND indicates '1', candidate data minimizing encoding bit of '1' is selected as the second intermediate data Y.

For example, in case the second data DATA2 is CSB data, the indicator information IND indicates locations where bits of LSB data are '1'. The Viterbi decoder 126c selects candidate data that is encoded in such a way that the number of bits each having a CSB value of the highest threshold voltage state S8 is minimized or, alternatively, reduced at locations indicated by the indicator information IND. For example, the Viterbi decoder 126c selects candidate data satisfying the following equation (3).

$$\wedge (Y, Z, IND) = \sum_{i=1}^{M} \overline{(Y_i \oplus Z_i)} \& IND_I, \text{minimize'0'} \qquad (3)$$

In the equation (3), "i" indicates a bit location of each of the second intermediate data Y, the first intermediate data Z, and the indicator information IND. "M" indicates the number of bits of each of the second intermediate data Y, the first intermediate data Z, and the indicator information IND.

For example, selected as the second intermediate data Y is candidate data minimizing or, alternatively, reducing '0' from a result of an AND operation on each bit of the indicator information IND and an intermediate result of an inverse of an exclusive-OR operation between each bit of the second intermediate data Y and each bit of the first intermediate data Z. That is, when each bit of the indicator information IND indicates '1', candidate data minimizing encoding bit of '0' is selected as the second intermediate data Y.

For example, in case the second data DATA2 is MSB data, and the LSB and CSB bits of the highest state (i.e., the eight state S8) are '1' and '0', respectively, the indicator information IND indicates locations where bits of LSB data are '1' and bits of CSB data are '0'. The Viterbi decoder 126c selects candidate data that is encoded in such a way that the number of bits each having an MSB value of the highest threshold voltage state S8 is minimized or, alternatively, reduced at locations indicated by the indicator information IND. For example, the Viterbi decoder 126c selects candidate data satisfying the above-described equation (2).

The Viterbi decoder 126c outputs the selected candidate data as the second intermediate data Y. For example, a plurality of candidate data the Viterbi decoder 126c generates may be codewords on convolutional codes. Thus, the second intermediate data Y is generated according to the following equation (4).

$$Y = a(k) \cdot G \qquad (4)$$

In the equation (4), "G" is a generation matrix for generating codewords on convolutional codes. "a(k)" indicates seeds for producing candidate data and has different values according to "k" (k being a positive integer between 1 and N).

The Viterbi decoder 126c forms a plurality of candidate data of which the number corresponds to a predetermined or, alternatively, reference value of N and outputs candidate data, satisfying the above-described condition, from among the plurality of candidate data as the second intermediate data Y.

In at least some other example embodiments of the inventive concepts, the Viterbi decoder 126c previously stores a plurality of candidate data of which the number corresponds to a predetermined or, alternatively, reference value of N and outputs candidate data, satisfying the above-described condition, from among the previously stored candidate data as the second intermediate data Y.

The operator 126d logically combines the first intermediate data Z and the second intermediate data Y. For example, the operator 126d performs an exclusive OR operation of the first intermediate data Z and the second intermediate data Y. An output of the operator 126d is first data DATA1 of which the encoding is completed and is expressed by the following equation (5).

$$\text{DATA1} = Z \oplus Y = \text{DATA2} \cdot (H^{-1})^T \oplus Y \quad (5)$$

The first data DATA1 is stored in a RAM 123 and is transferred to the calculator 126e. The calculator 126e updates the indicator information IND using the first data DATA1. For example, a bit, placed at a location corresponding to the highest threshold voltage state S8, of the first data DATA1 maintains a first value, and bits at other locations are updated with a second value.

According to one or more example embodiments of the inventive concepts, the buffer 126b may not be in the encoder 126EN. For example, according to at least some example embodiments of the inventive concepts, the RAM 123 may replace, and perform the function of, the buffer 126b. In this case, the first intermediate data Z output from the inverse syndrome former 126a may be stored in the RAM 124. The first intermediate data Z may be output to the calculator 126d.

The decoder 126DE includes a syndrome former 126j. The syndrome former 126j receives first data DATA1 from the RAM 123. The syndrome former 126j calculates the first data DATA1 and a parity check matrix $H^T$ to restore second data DATA2. The second data DATA2 is stored in the RAM 123. Referring to the equation (5), an output of the syndrome former 126j is expressed by the following equation (6).

$$\text{OUT} = \text{DATA1} \cdot H^T = (Z \oplus Y) \cdot H^T \quad (6)$$

In the equation (6), a relation between the parity check matrix $H^T$ and the generation matrix G is expressed by the following equation (7).

$$G \cdot H^T = 0 \quad (7)$$

Thus, referring to the equation (4), a result of calculating the second intermediate date Y and the parity check matrix $H^T$ is '0' as expressed by the following equation (8).

$$Y \cdot H^T = a(k) \cdot G \cdot H^T = 0 \quad (8)$$

With the equations (6) and (8), an output of the syndrome former 126j is the second data DATA2 as expressed by the following equation (9).

$$\text{OUT} = Z \cdot H^T = \text{DATA2} \cdot (H^{-1})^T \cdot H^T = \text{DATA2} \quad (9)$$

That is, the second data DATA2 is restored by the syndrome former 126j.

Figure 12:
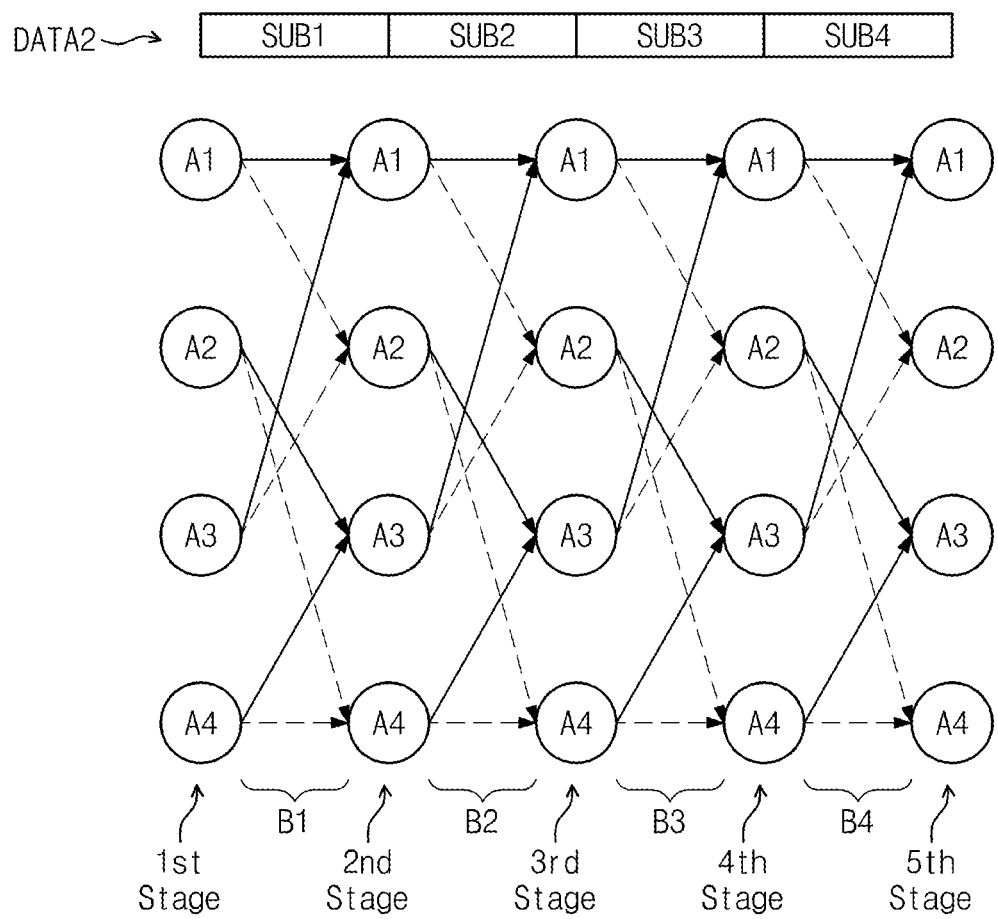
FIG. 12 is a diagram schematically illustrating how a Viterbi decoder selects second intermediate data Y of a plurality of candidate data.

FIG. 12 is a diagram schematically illustrating how a Viterbi decoder 126c selects second intermediate data Y of a plurality of candidate data. Referring to FIG. 12, second data DATA2 is divided into a plurality of sub blocks SUB1 to SUB4 that correspond to a plurality of branch areas B1 to B4, respectively. Each branch area is placed between two stages. For example, the first branch area B1 is located between first and second stages, the second branch area B2 is located between second and third stages, the third branch area B3 is located between third and fourth stages, and the fourth branch area B4 is located between fourth and fifth stages.

Allocated to each stage are a plurality of states A1 to A4. Each state may have two output branches or two input branches. For example, each state of the first stage has two output branches. Each state of each of the second to fourth stages has two input branches and two output branches. Each state of the fifth stage has two input branches.

In each branch area, one sub candidate data is allocated to one branch. Different sub candidate data may be allocated to branches in the same branch area. The same sub candidate data is allocated to branches of which the input and output states are the same. For example, at the first branch area B1, different sub candidate data may be allocated to a branch from the first state A1 toward the second state S2 and a branch from the third state A3 toward the second state A2. For example, at the first and second branch areas B1 and B2, the same sub candidate data is allocated to a branch from the second state A2 toward the fourth state A4.

A Viterbi decoder 126c calculates branch metrics at each branch area according to the equation (2) or (3). For example, if second data DATA2 is LSB data or MSB data, the Viterbi decoder 126c calculates branch metrics according to the equation (2). For example, if second data DATA2 is CSB data, the Viterbi decoder 126c calculates branch metrics according to the equation (3).

The Viterbi decoder 126c calculates path metrics. The Viterbi decoder 126c calculates paths from one state of a first stage to one state of a fifth stage. A sum of branch metrics of branches each path passes through may be calculated as a path metric of each path. The Viterbi decoder 126c selects a path that has path metrics of which the number is smallest. The Viterbi decoder 126c combines sub candidate data allocated to branches included in the selected path and outputs a combined result as second intermediate data Y.

FIG. 13 is a table schematically illustrating sub candidate data allocated to branches of each branch area. Referring to FIGS. 12 and 13, first sub candidate data Y1 is allocated to a branch B11 that has a first state A1 as both a start state and an end state. Second sub candidate data Y2 is allocated to a branch B12 that has a first state A1 as a start state and a second state A2 as an end state. Third sub candidate data Y3 is allocated to a branch B23 that has the second state A2 as a start state and a third state A3 as an end state. Fourth sub candidate data Y4 is allocated to a branch B24 that has the second state A2 as a start state and a fourth state A4 as an end state. Fifth sub candidate data Y5 is allocated to a branch B31 that has the third state A3 as a start state and the first state A1 as an end state. Sixth sub candidate data Y6 is allocated to a branch B32 that has the third state A3 as a start state and the second state A2 as an end state. Sixth sub candidate data Y7 is allocated to a branch B43 that has the fourth state A4 as a start state and the third state A3 as an end state. Eighth sub candidate data Y8 is allocated to a branch B44 that has the fourth state A4 as a start state and the fourth state A4 as an end state.

The branch B12 is selected at a first branch area B1, the branch B24 is selected at a second branch area B2, and the branch B43 is selected at a fourth branch area B4. If the branch B32 is selected at the third branch area B3, second, fourth, seventh, and sixth sub data Y2, Y4, Y7, and Y6 are combined. The combined result may be output as second intermediate data Y.

Figure 14:
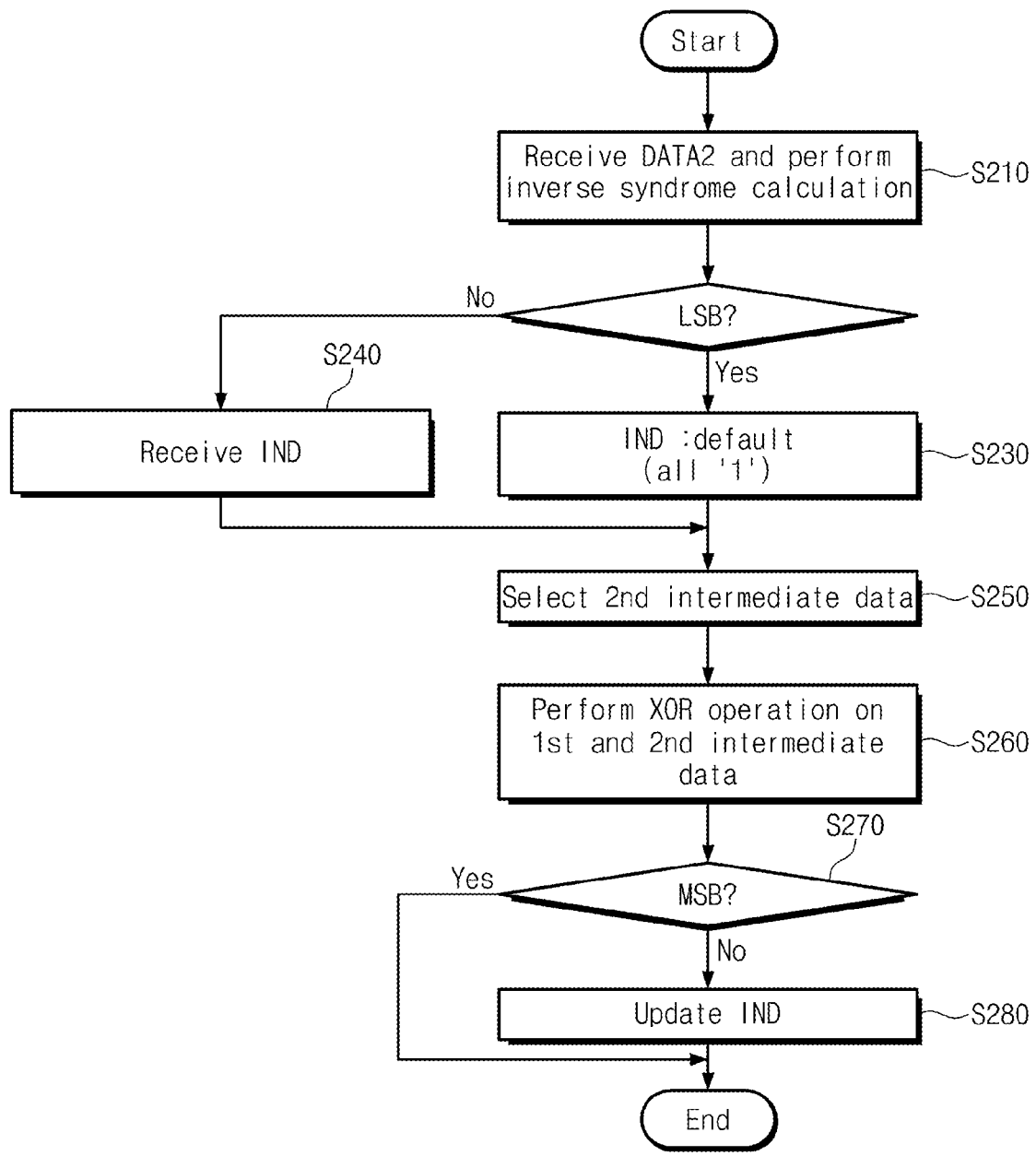
FIG. 14 is a flow chart schematically illustrating an operating method of an encoder according to at least one example embodiment of the inventive concepts.

FIG. 14 is a flow chart schematically illustrating an operating method of an encoder 126EN according to at least one example embodiment of the inventive concepts. Referring to FIGS. 11 and 14, in step S210, an inverse syndrome former 126a receives second data DATA2 from a RAM 123 to perform an inverse syndrome operation. The inverse syndrome former 126a generates first intermediate data Z as a result of the inverse syndrome operation.

In step S220, whether the second data DATA2 is LSB data is determined. If the second data DATA2 is LSB data, in step S230, indicator information IND is set with a default value. For example, each bit of the indicator information IND is set with '1'. The indicator information IND thus set is provided to a Viterbi decoder 126c.

If the second data DATA2 is not LSB data, in step S240, the Viterbi decoder 126c receives indicator information IND from the RAM 123.

In step S250, the Viterbi decoder 126c selects second intermediate data Y.

In step S260, an operator 126d performs an exclusive OR operation on first intermediate data Z and the second intermediate data Y. A result of the exclusive OR operation is stored in the RAM 123 as the first data DATA1.

In step S270, whether the second data DATA2 is MSB data is determined. If the second data DATA2 is MSB data, in step S280, the indicator information IND is updated. For example, bits that have a value of '1' and are placed at the same locations as bits, corresponding to the highest threshold voltage state, of the first data DATA1 are updated with '0'.

According to one or more example embodiments of the inventive concepts, one indicator information IND may be made from memory cells in a row corresponding to a write unit. If writing MSB data at memory cells in a row is completed, indicator information IND of the row may be released.

According to one or more example embodiments of the inventive concepts, a write operation may be alternately performed with respect to a plurality of rows. If second data DATA2 to be written at a row is received, indicator information IND of a corresponding row may be generated or called. That is, if a write operation is alternately performed with respect to a plurality of rows, a plurality of indicator information each corresponding to a plurality of rows to which alternate writing is applied may be managed on the RAM 123. For example, a plurality of indicator information may be managed on the RAM 123 in the table form.

According to one or more example embodiments of the inventive concepts, after encoding LSB data to MSB data to be written at memory cells in a row is completed, encoded LSB to MSB data may be transferred to a nonvolatile memory 110 (refer to FIG. 1). Afterwards, the nonvolatile memory 110 may write the input data at memory cells in a row.

In at least some other example embodiments of the inventive concepts, whenever encoding LSB data, CSB data, or MSB data to be written at memory cells in a row is completed, encoded LSB, CSB, or MSB data may be transferred to the nonvolatile memory 110. Whenever encoded LSB, CSB, or MSB data is received, the nonvolatile memory 110 may write the input data at memory cells in a row. The nonvolatile memory 110 waits until encoded LSB data, encoded CSB data, and encoded MSB data are all collected, and then, it writes the encoded LSB, CSB, and MSB data thus collected.

As described above, write data may be encoded according to the write data and adjacent data (e.g., lower data) associated with the write data, thereby improving reliability of a storage device.

In particular, in a nonvolatile memory 110 with a structure described with reference to FIG. 4, a write operation is performed by a unit of a selected row of a selected plane. To optimize operating performance of the nonvolatile memory 110, a memory controller 120 collects write data each corresponding to a plurality of rows and writes the collected write data at the nonvolatile memory 110. That is, when write data is provided to the memory controller 120, adjacent data (e.g., lower data) associated with the write data may be kept in the memory controller 120. Thus, the operations of encoding and using write data and adjacent data (e.g., lower data) performed by the storage device 100, since the operations may be performed without causing the additional overhead which may result if the that adjacent data must be stored in the nonvolatile memory 110 by a storage operation that is separate from that by which the write data is stored.

In case the memory controller 120 collects write data corresponding to a plurality of rows, the write data may be stored in the memory controller 120 together with upper data of the write data. The spirit and features of at least some example embodiments of the inventive concepts are applicable to encoding write data using the write data and upper data of the write data.

Figure 15:
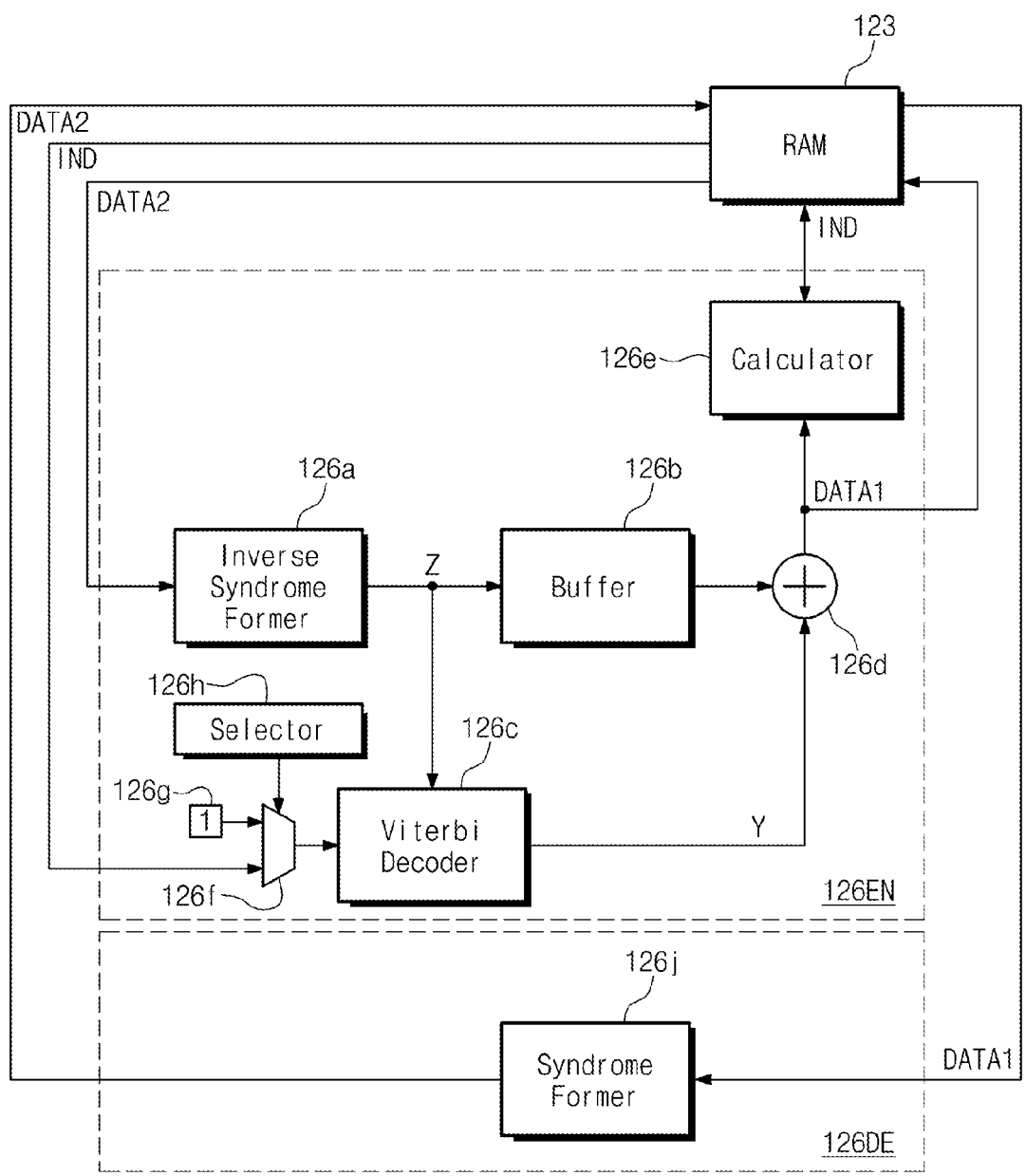
FIG. 15 is a block diagram schematically illustrating a shape encoder and decoder block and a RAM communicating with the shape encoder and decoder block, according to at least one other example embodiment of the inventive concepts.

FIG. 15 is a block diagram schematically illustrating a shape encoder and decoder block 126 and a RAM 123 communicating with the shape encoder and decoder block 126, according to at least one or more other example embodiments of the inventive concepts. Compared to an encoder 126EN shown in FIG. 11, an encoder 126EN' shown in FIG. 15 further comprises a multiplexer 126f, a register 126g, and a selector 126h.

The multiplexer 126f is adapted to transfer either indicator information IND or an output of the register 126g to a Viterbi decoder 126c. The register 126g is adapted to output a value of '1'. The selector 126h is adapted to output a selection signal to the multiplexer 126f.

According to a control of the selector 126h, the multiplexer 126f transfers a first portion of the indicator information IND to the Viterbi decoder 126c and does an output of the register 126g to the Viterbi decoder 126c instead of the rest of the indicator information IND.

While the indicator information IND is transferred, the Viterbi decoder 126c outputs second intermediate data Y selected according to the above-described referred encoding RE. While an output of the register 126h is transferred, the Viterbi decoder 126c outputs second intermediate data Y selected according to the above-described separate encoding SE.

The indicator information IND is unnecessary when the separated encoding SE is made. Thus, if an encoder 126EN is configured in such a way that the referred encoding RE is performed with respect to a portion of second data DATA2 and the separate encoding SE is performed with respect to the rest of the second data DATA2, there is reduced the size of the indicator information IND to be stored in the RAM 123. Such an arrangement may reduce a demand on resources of the RAM 123 and enable operating performance of a storage device 100 to be improved. Also, the fabrication costs of the storage device 100 may be reduced because the capacity of the RAM 123 may be decreased.

Figure 16:
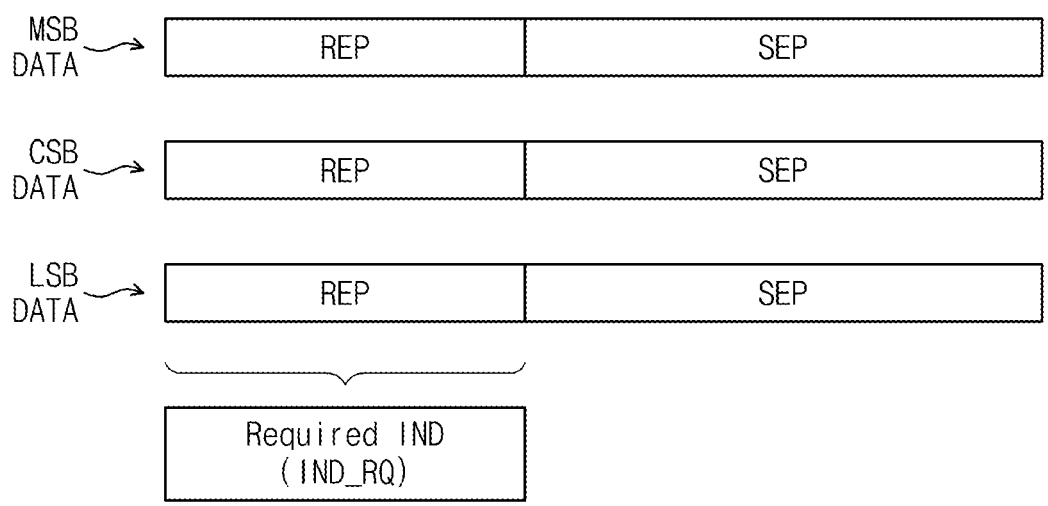
FIG. 16 shows how a capacity of indicator information is reduced when referred encoding and separate encoding are used together.

FIG. 16 shows how a capacity of indicator information IND is reduced when referred encoding RE and separate encoding SE are used together. Referring to FIG. 16, first portions REP of LSB, CSB, and MSB data are encoded according to referred encoding RE, and second portions thereof are encoded according to separated encoding SE. In this case, the size of required indicator information IND is the same as those of the first portions REP.

Likewise, portions of LSB, CSB, and MSB data are encoded according to the referred encoding RE, and remaining portions thereof are encoded according to the separate encoding SE. For example, LSB and CSB data are encoded according to the referred encoding RE and MSB data is encoded according to the separate encoding SE. In this case, indicator information IND is unnecessary when the MSB data is encoded. Thus, the indicator information IND is released after encoding CSB data is completed. Such an arrangement may reduce a demand on resources of the RAM 123 and enable operating performance of the storage device 100 to be improved. Also, the fabrication costs of the storage device 100 may be reduced because the capacity of the RAM 123 may be decreased.

Figure 17:
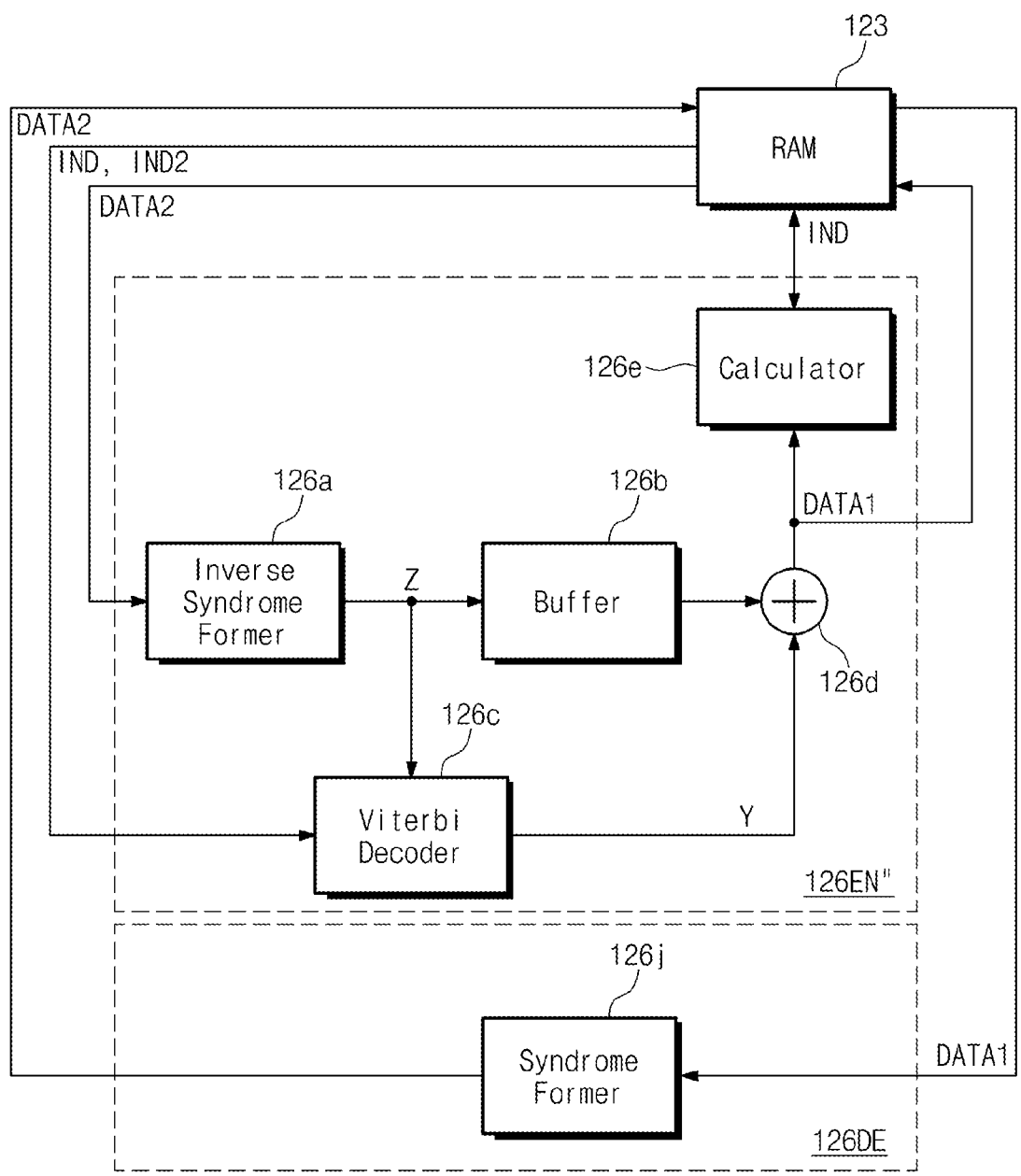
FIG. 17 is a block diagram schematically illustrating a shape encoder and decoder block and a RAM communicating with the shape encoder and decoder block, according to one or more other example embodiments of the inventive concepts.

FIG. 17 is a block diagram schematically illustrating a shape encoder and decoder block 126 and a RAM communicating with the shape encoder and decoder block 126, according to at least one or more other example embodiments of the inventive concepts. An encoder 126EN" is different from an encoder 126EN illustrated in FIG. 11 in that the encoder 126EN" is configured to receive second indicator information IND2 stored in a RAM 123. The second indicator information IND2 indicates locations (e.g., locations associated with locations of memory cells of a row at which adjacent data is to be written), corresponding to the highest threshold voltage state, of adjacent data (e.g., data including LSB data, CSB data, and MSB data) that is to be written at second memory cells of a row adjacent to a row of memory cells at which second data DATA2 is to be written.

A Viterbi decoder 126c receives indicator information IND and second indicator information IND2 from a RAM 123. The Viterbi decoder 126c encodes second data DATA2 in such a way that the second data DATA2 does not correspond to the lowest threshold voltage state (e.g., erase state) at a location where the second indicator information IND2 has a first value (e.g., '1') or in such a way that the number of bits each of which at least corresponds to the lowest threshold voltage state.

According to one or more example embodiments of the inventive concepts, encoding using the second indicator information IND2 may be performed once at a row of memory cells. For example, the second indicator information IND2 is used when the second data DATA2 is MSB data, and it is not used when the second data DATA2 is LSB data or CSB data. Alternatively, the second indicator information IND2 is used when the second data DATA2 is CSB data, and it is not used when the second data DATA2 is LSB data or MSB data. As another alternative, the second indicator information IND2 is used when the second data DATA2 is LSB data, and it is not used when the second data DATA2 is CSB data or MSB data.

In at least some other example embodiments of the inventive concepts, encoding using the second indicator information IND2 may be performed two times at a row. The number of encoding operations that are performed using the second indicator information IND2 at a row is not restricted.

According to one or more example embodiments of the inventive concepts, a calculator 126e updates indicator information IND even though second data DATA2 to be written at memory cells of a first row is MSB data. The indicator information IND updated by the calculator 126e when second data DATA2 is MSB data may be used as the second indicator information IND2 when there is encoded second data DATA2 to be written at memory cells of a second row.

Figure 18:
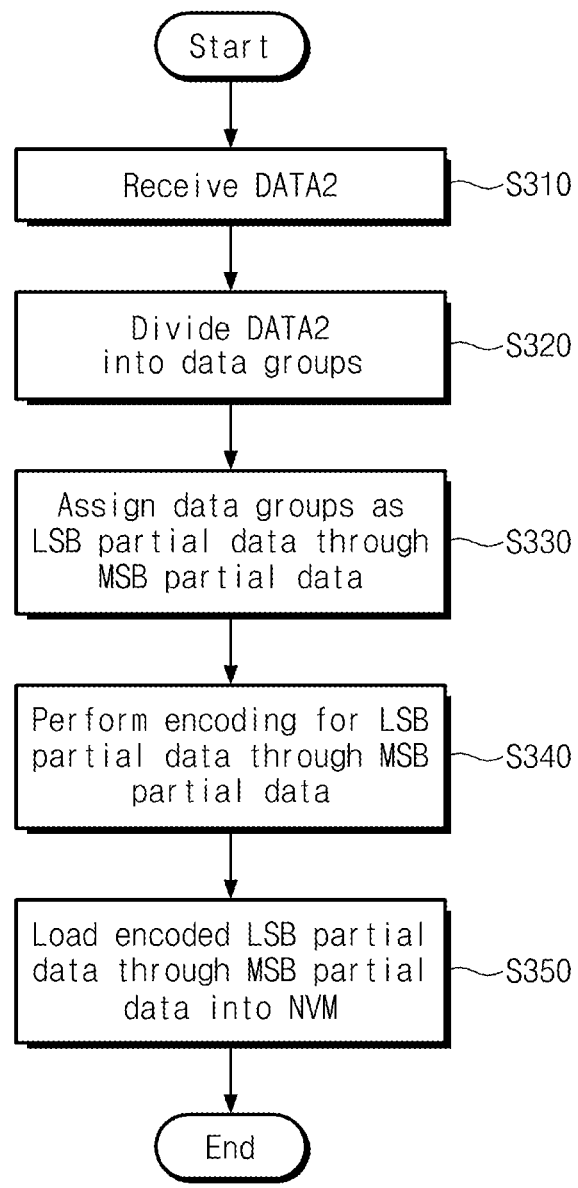
FIG. 18 is a flow chart schematically illustrating an operating method of a storage device 100, according to at least one other example embodiment of the inventive concepts.

FIG. 18 is a flow chart schematically illustrating an operating method of a storage device 100, according to at least one or more other example embodiments of the inventive concepts. Referring to FIGS. 1 and 18, in step S310, a memory controller 120 receives second data DATA2. The second data DATA2 is stored in a RAM 123. The second data DATA2 has the size corresponding to the number of memory cells of a row of a nonvolatile memory 110. For example, the size of the second data DATA2 is the same as that of LSB data, CSB data or MSB data to be written at memory cells of a row.

In step S320, the memory controller 120 divides the second data DATA2 into a plurality of data groups.

In step S330, the memory controller 120 assigns the data groups to LSB partial data, CSB partial data, and MSB partial data.

In step S340, the memory controller 120 encodes the LSB partial data, CSB partial data, and MSB partial data. For example, a shape encoder and decoder block 126 encodes the LSB partial data and updates indicator information IND. The shape encoder and decoder block 126 encodes the CSB partial data using the indicator information IND and updates indicator information IND. The shape encoder and decoder block 126 encodes the MSB partial data using the indicator information IND.

In step S350, the encoded LSB partial data, CSB partial data and MSB partial data are loaded on a nonvolatile memory 110. For example, whenever encoding of each partial data is completed, each partial data may be loaded on the nonvolatile memory 110. After encoded, LSB partial data, CSB partial data and MSB partial data are loaded on the nonvolatile memory 110.

LSB partial data is written at memory cells of a selected row of the nonvolatile memory 110 as LSBs. CSB partial data is written at the memory cells of the selected row of the nonvolatile memory 110 as CSBs. MSB partial data is written at the memory cells of the selected row of the nonvolatile memory 110 as MSBs.

Figure 19:
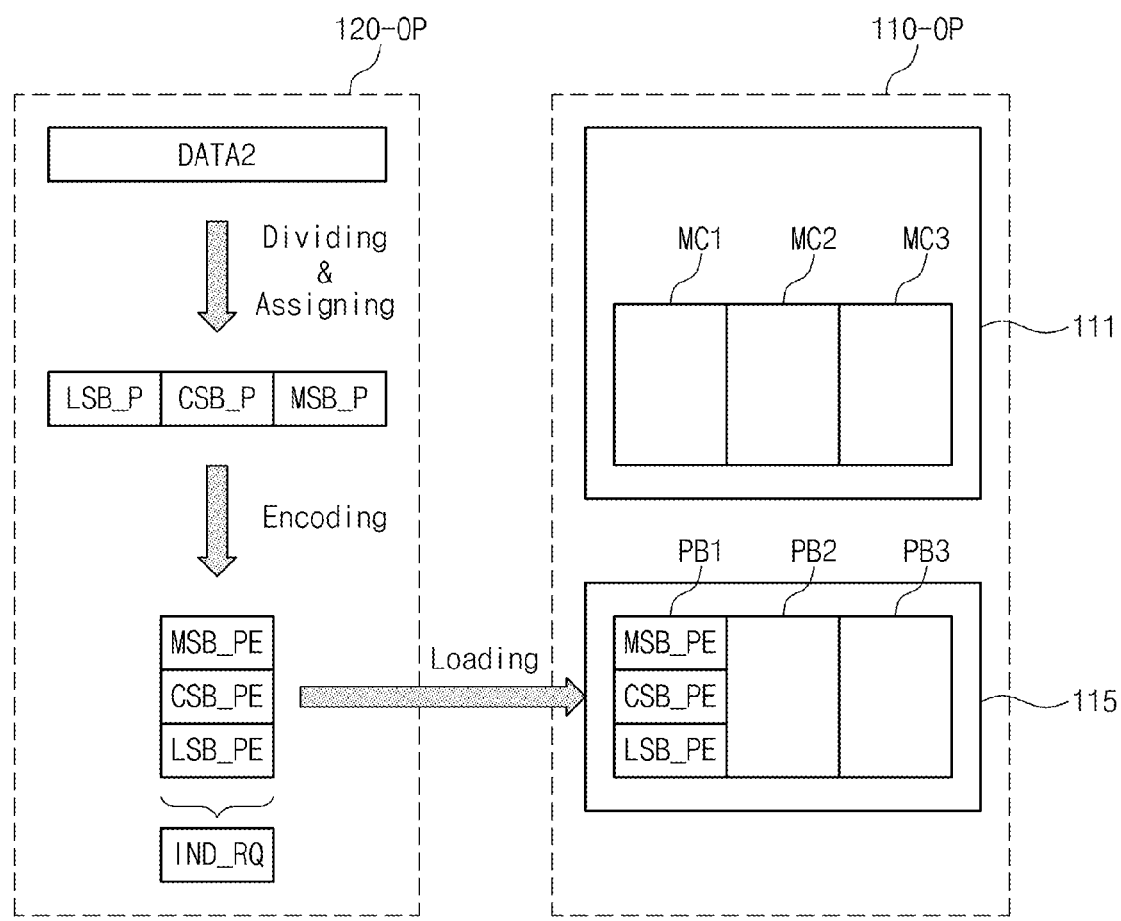
FIGS. 19 to 21 show embodiments where encoding is performed according to a method of FIG. 18 and data is written.
Figure 20:
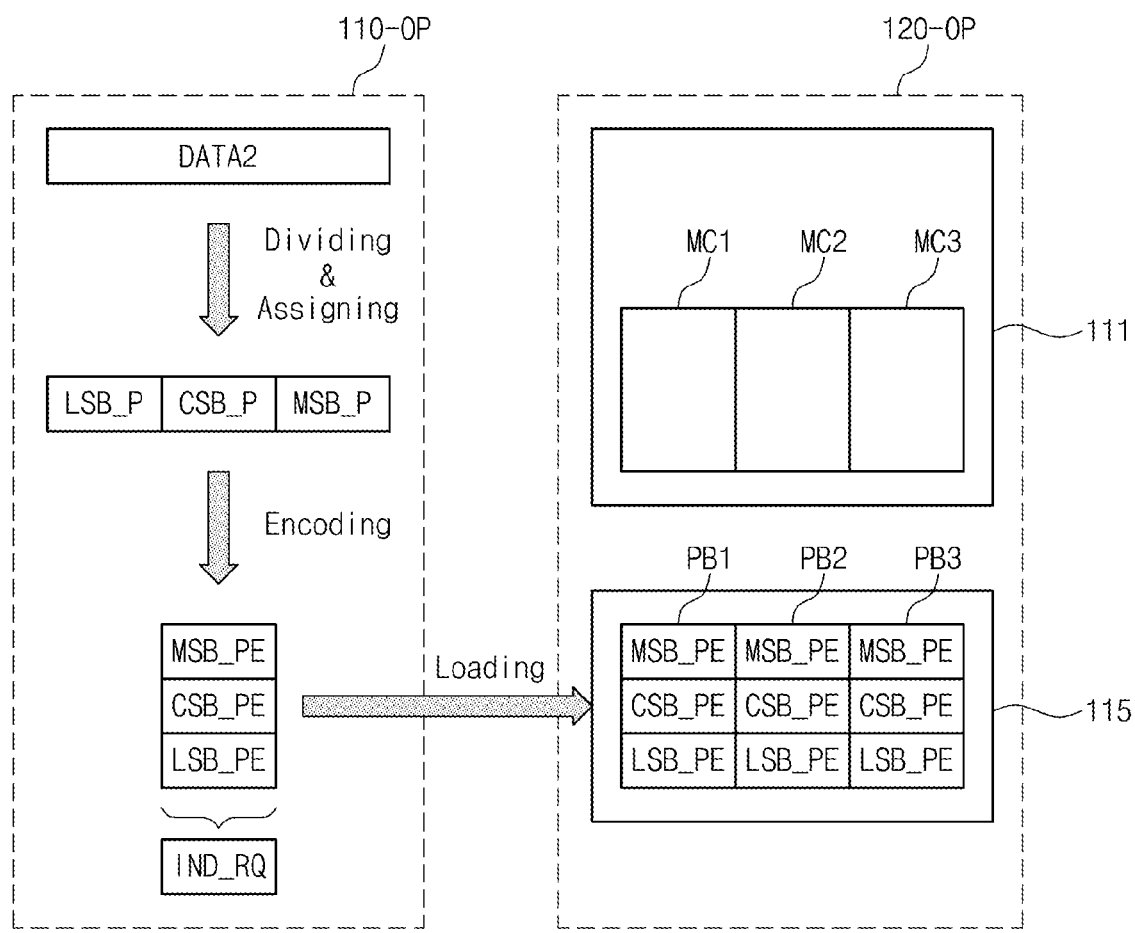
Figure 21:
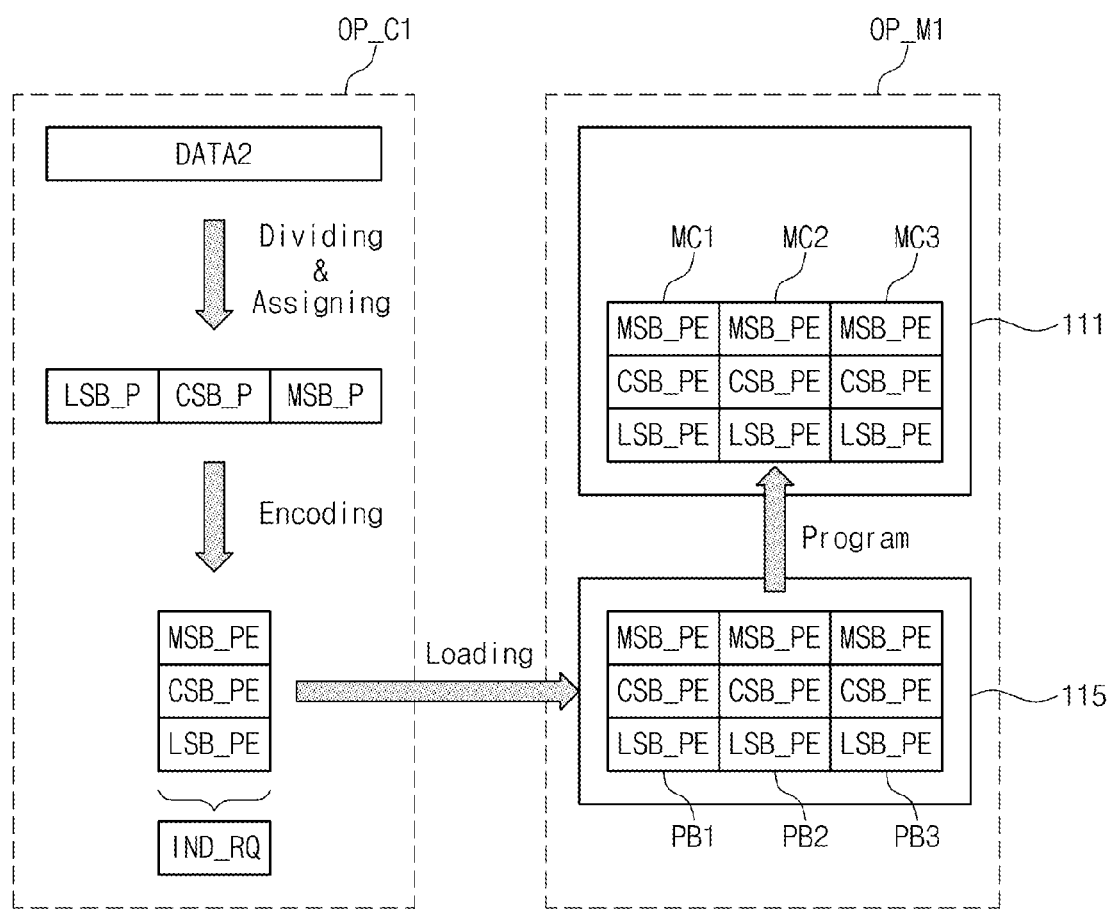

FIGS. 19 to 21 show embodiments where encoding is performed according to a method of FIG. 18 and data is written. In FIGS. 19 to 21, "120_OP" shows an operation a memory controller 120 performs, and "110_OP" shows an operation a nonvolatile memory 110 performs.

Referring to FIGS. 1, 3, and 19, second data DATA2 is provided to a memory controller 120. First data DATA1 has the same size as LSB, CSB or MSB data to be written at memory cells MC1, MC2, and MC3 of a row.

The second data DATA2 received is divided into LSB partial data LSB_P, CSB partial data CSB_P, and MSB partial data MSB_P.

The LSB partial data LSB_P, the CSB partial data CSB_P, and the MSB partial data MSB_P are encoded into LSB partial encoding data LSB_PE, CSB partial encoding data CSB_PE, and MSB partial encoding data MSB_PE, respectively. At this time, there is required indicator information IND_RQ that has the same size as the LSB partial data LSB_P, CSB partial data CSB_P, and MSB partial data MSB_P.

The LSB partial encoding data LSB_PE, CSB partial encoding data CSB_PE, and MSB partial encoding data MSB_PE are loaded on a page buffer circuit 115 of a nonvolatile memory 110. For example, the LSB partial encoding data LSB_PE, CSB partial encoding data CSB_PE, and MSB partial encoding data MSB_PE are loaded on first page buffers PB1 of a plurality of page buffers of the page buffer circuit 115. The first page buffers PB1 may be connected to first memory cells MC1 of a plurality of memory cells of a selected row through bit lines. The LSB partial encoding data LSB_PE may be loaded on LSB latches of the first page buffers PB1, the CSB partial encoding data CSB_PE may be loaded on CSB latches of the first page buffers PB1, and the MSB partial encoding data MSB_PE may be loaded on MSB latches of the first page buffers PB1.

Referring to FIGS. 1, 3, and 20, second data DATA2 is further provided to the memory controller 120. The second data DATA2 further provided is divided, encoded, and loaded on the page buffer circuit 115. For example, LSB partial encoding data LSB_PE, CSB partial encoding data CSB_PE, and MSB partial encoding data MSB_PP are loaded on second page buffers PB2 of the page buffer circuit 115. The second page buffers PB2 may be connected to second memory cells MC2 of the plurality of memory cells of the selected row through the bit lines. The LSB partial encoding data LSB_PE may be loaded on LSB latches of the second page buffers PB2, the CSB partial encoding data CSB_PE may be loaded on CSB latches of the second page buffers PB2, and the MSB partial encoding data MSB_PP may be loaded on MSB latches of the second page buffers PB2.

Referring to FIGS. 1, 3, and 21, second data DATA2 is further provided to the memory controller 120. The second data DATA2 further provided is divided, encoded, and loaded on the page buffer circuit 115. For example, LSB partial encoding data LSB_PE, CSB partial encoding data CSB_PE, and MSB partial encoding data MSB_PE are loaded on third page buffers PB3 of the page buffer circuit 115. The third page buffers PB3 may be connected to third memory cells MC3 of the plurality of memory cells of the selected row through the bit lines. The LSB partial encoding data LSB_PE may be loaded on LSB latches of the third page buffers PB3, the CSB partial encoding data CSB_PE may be loaded on CSB latches of the third page buffers PB3, and the MSB partial encoding data MSB_PE may be loaded on MSB latches of the third page buffers PB3.

Referring to FIGS. 1, 3, and 21, data loaded on the page buffer circuit 115 may be written at the memory cells MC1, MC2, and MC3 of the selected row.

As described above, second data DATA2 provided to the memory controller 120 is divided into LSB partial data through MSB partial data, the LSB partial data through MSB partial data are encoded, and the encoded results are loaded on the nonvolatile memory 110. At this time, the size of required indicator information IND_REQ may be smaller than that of LSB data, CSB data or MSB data to be written at memory cells of a row. Such an arrangement may reduce a demand on resources of a RAM 123 and enable operating performance of a storage device 100 to be improved. Also, the fabrication costs of the storage device 100 may be reduced because the capacity of the RAM 123 may be decreased.

Figure 22:
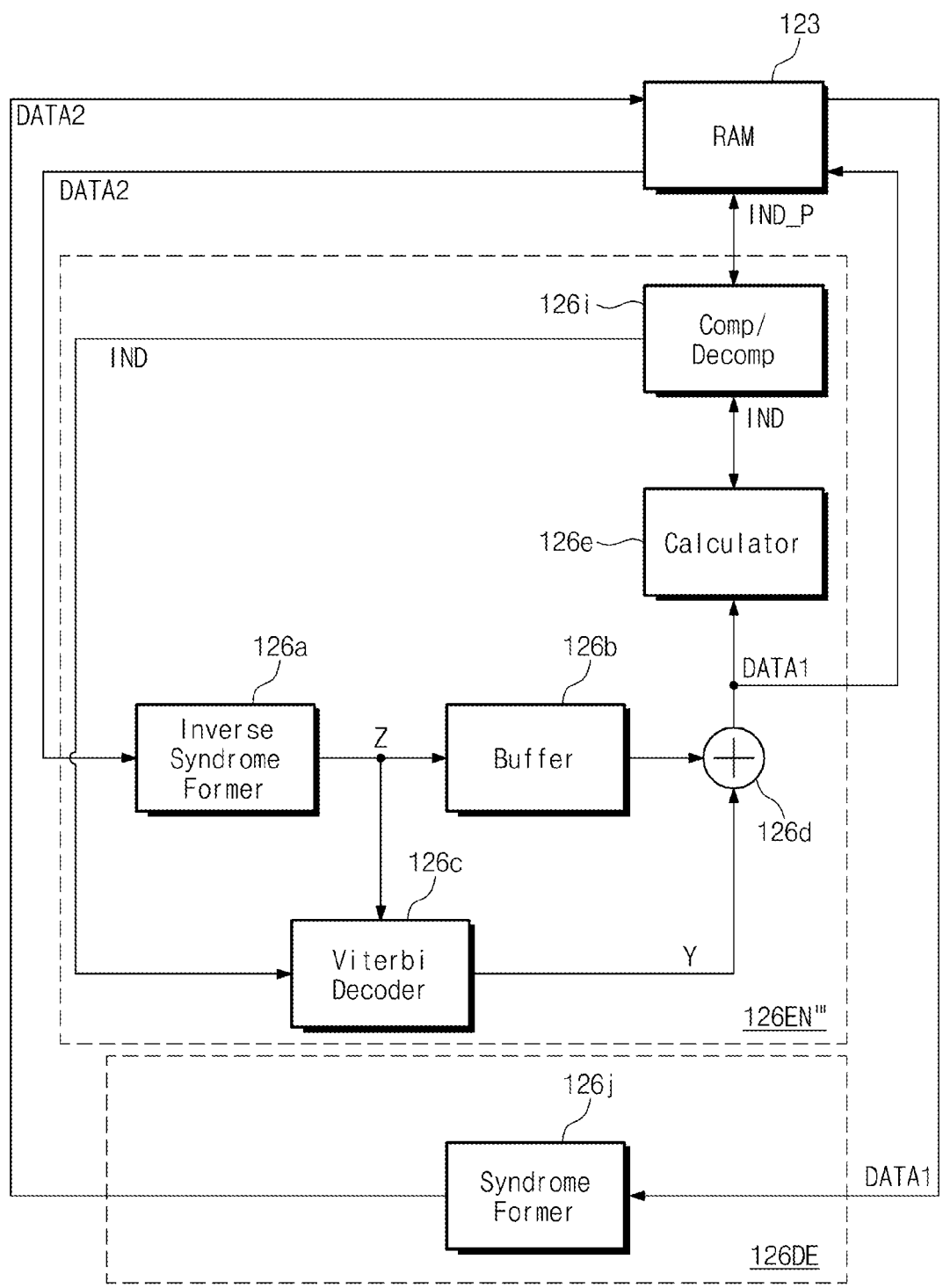
FIG. 22 is a block diagram schematically illustrating a shape encoder and decoder block and a RAM communicating with the shape encoder and decoder block, according to one or more other example embodiments of the inventive concepts.

FIG. 22 is a block diagram schematically illustrating a shape encoder and decoder block 126 and a RAM 123 communicating with the shape encoder and decoder block 126, according to at least one or more other example embodiments of the inventive concepts. Referring to FIG. 22, an encoder 126EN''' differs from an encoder 126EN of FIG. 11 in that the encoder 126EN''' further comprises a compression module 126*i*.

The compression module 126*i* compresses indicator information IND from a calculator 126*e* and outputs compression indicator information IND_P. The compression module 126*i* stores the compression indicator information IND_P in a RAM 123. The compression module 126*i* reads the compression indicator information IND_P from the RAM 123. The compression module 126*i* decompresses the compression indicator information IND_P to restore indicator information IND. The compression module 126*i* provides the restored indicator information IND to the calculator 126*e* or a Viterbi decoder 126*c*.

As described above, indicator information IND is compressed when being stored in the RAM 123. Thus, it is possible to reduce a capacity of the RAM 123 needed to store compression indicator information. This makes it easy to secure resource of a RAM 123 and enables operating performance of a storage device 100 to be improved. Also, the fabrication costs of the storage device 100 may be reduced because the capacity of the RAM 123 decreases.

As described with reference to FIG. 10, a memory controller 120 includes an ECC block 124. The ECC block 124 performs error correction encoding on second data DATA2 received from an external host device. The error correction encoding may be made after encoding according to at least one example embodiment of the inventive concepts is performed. The ECC block 124 performs error correction decoding on first data DATA1 received from a nonvolatile memory 110. Decoding according to at least one example embodiment of the inventive concepts is performed after the error correction decoding.

According to one or more example embodiments of the inventive concepts, the memory controller 120 may further comprise a randomizer that is configured to level threshold voltage distribution states of memory cells. Encoding of the randomizer may be performed before encoding according to at least one example embodiment of the inventive concepts. Decoding of the randomizer may be performed after decoding according to at least one example embodiment of the inventive concepts.

According to one or more example embodiments of the inventive concepts, the memory controller 120 may be configured to encipher data to be written at the nonvolatile memory 110. Encryption encoding may be carried out before encoding according to at least one example embodiment of the inventive concepts or before encoding of the randomizer. Encryption decoding may be carried out after decoding according to at least one example embodiment of the inventive concepts or after decoding of the randomizer.

Figure 23:
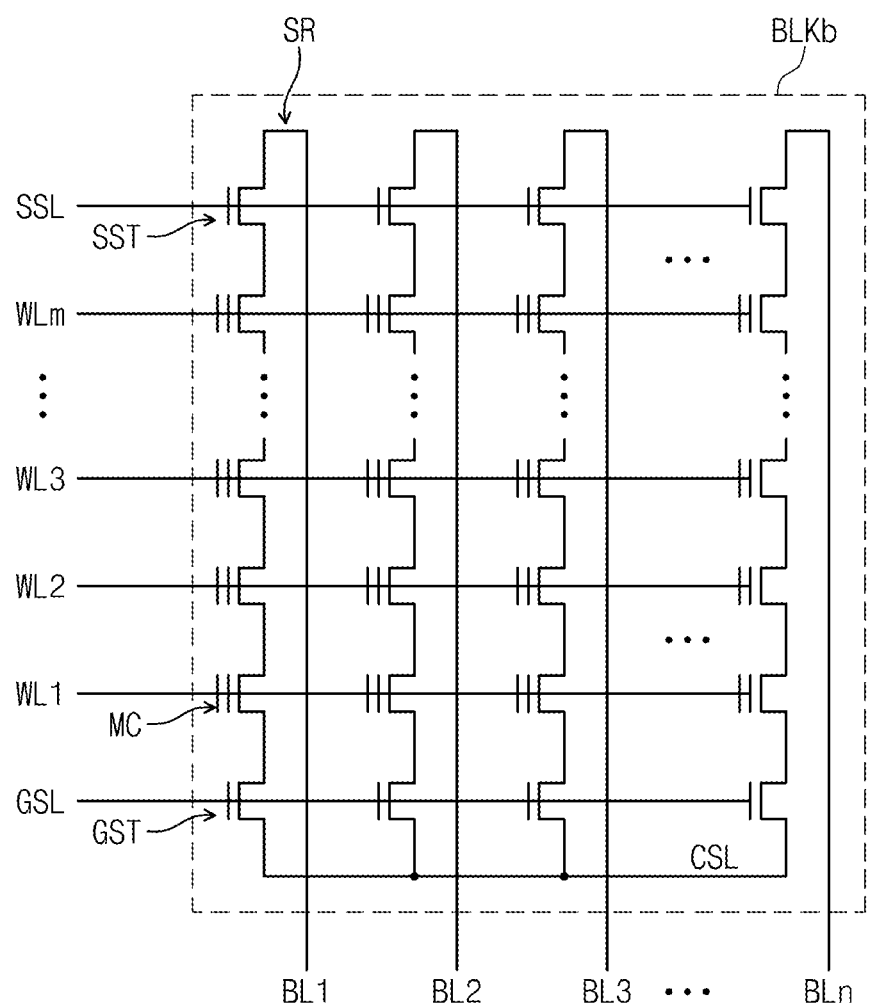
FIG. 23 is a circuit diagram schematically illustrating a memory block according to at least one other example embodiment of the inventive concepts.

FIG. 23 is a circuit diagram schematically illustrating a memory block BLKb according to at least one or more other example embodiments of the inventive concepts. Referring to FIG. 23, a memory block BLKb includes a plurality of strings SR, which are connected to a plurality of bit lines BL1 to BLn, respectively. Each string SR contains a ground selection transistor GST, memory cells MC, and a string selection transistor SST.

In each string SR, the ground selection transistor GST is connected between the memory cells MC and a common source line CSL. The ground selection transistors GST of the strings SR are connected in common to the common source line CSL.

In each string SR is the string selection transistor SST connected between the memory cells MC and a bit line BL. The string selection transistors SST of the strings SR are connected to a plurality of bit lines BL1 to BLn, respectively.

In each string SR, the plurality of memory cells MC are connected between the ground selection transistor GST and the string selection transistor SST. In each string SR, the plurality of memory cells MC are connected in series.

In the strings SR are memory cells MC having the same height from the common source line CSL connected in common to a word line. The memory cells MC of the strings SR are connected to a plurality of word lines WL1 to WLm.

Figure 24:
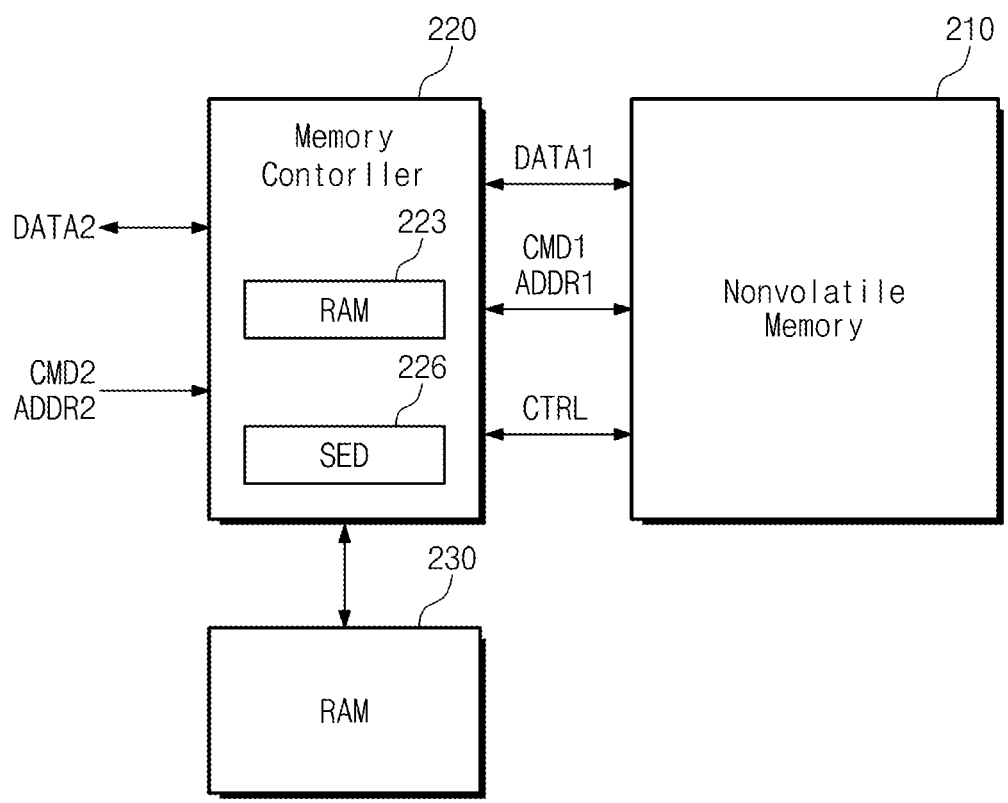
FIG. 24 is a block diagram schematically illustrating a storage device according to at least one other example embodiment of the inventive concepts.

FIG. 24 is a block diagram schematically illustrating a storage device 200 according to at least one or more other example embodiments of the inventive concepts. Referring to FIG. 24, a storage device 200 contains a nonvolatile memory 210, a memory controller 220, and a RAM 230. The memory controller 220 includes a RAM 223 and a shape encoder and decoder block 226.

As compared to a storage device 100 illustrated in FIG. 1, the storage device 200 further includes the RAM 230. The RAM 230 may include at least one of a variety of random access memories, such as, but not limited to, a static RAM, a dynamic RAM, a Phase-change RAM (PRAM), a Magnetic RAM (MRAM), a Resistive RAM (RRAM), a Ferroelectric RAM (FRAM), and so on.

Second data DATA2 to exchange with an external host device may be stored in the RAM 230 outside of the memory controller 220, instead of a RAM 223 included in the memory controller 220. First data DATA1 to exchange with the nonvolatile memory 210 may be stored in the RAM 230 outside of the memory controller 220, instead of the RAM 223 included in the memory controller 220. The RAM 230 may be used as a buffer memory or a cache memory of the storage device 200.

Figure 25:
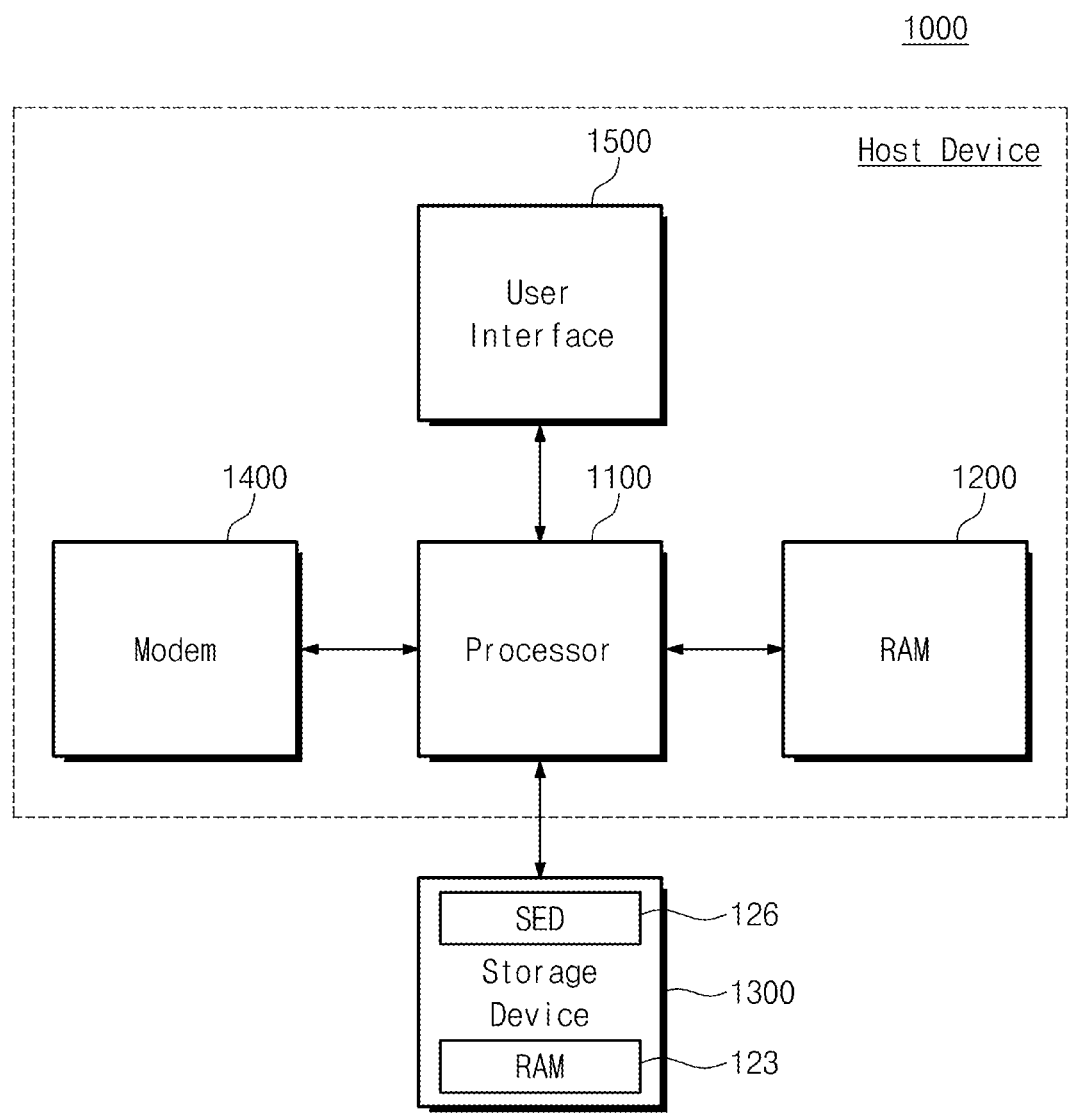
FIG. 25 is a block diagram schematically illustrating a computing device according to at least one example embodiment of the inventive concepts.

FIG. 25 is a block diagram schematically illustrating a computing device 1000 according to at least one example embodiment of the inventive concepts. Referring to FIG. 25, a computing device 1000 includes a processor 1100, a RAM 1200, a storage device 1300, a modem 1400, and a user interface 1500.

The processor 1100 controls an overall operation of the computing device 1000 and performs a logical operation. The processor 1100 is formed of a system-on-chip (SoC). The processor 1100 may be a general purpose processor (e.g., programmed to operate in a particular manner), a specific-purpose processor, or an application processor.

The RAM 1200 communicates with the processor 1100. The RAM 1200 may be a working memory of the processor 1100 or the computing device 1000. The processor 1100 stores codes or data in the RAM 1200 temporarily. The processor 1100 executes codes using the RAM 1200 to process data. The processor 1100 executes a variety of software, such as, but not limited to, an operating system and an application, using the RAM 1200. The processor 1100 controls an overall operation of the computing device 1000 using the RAM 1200. The RAM 1200 may include a volatile memory such as, but not limited to, a static RAM, a dynamic RAM, a synchronous DRAM, and so on or a nonvolatile memory such as, but not limited to, a Phase-change RAM (PRAM), a Magnetic RAM (MRAM), a Resistive RAM (RRAM), a Ferroelectric RAM (FRAM), and so on.

The storage device 1300 communicates with the processor 1100. The storage device 1300 is used to store data for a long time. That is, the processor 110 stores data, which is to be stored for a long time, in the storage device 1300. The storage device 1300 stores a boot image for driving the computing device 1000. The storage device 1300 stores source codes of a variety of software, such as an operating system and an application. The storage device 1300 stores data that is processed by a variety of software, such as an operating system and an application.

According to one or more example embodiments of the inventive concepts, the processor 1100 loads source codes stored in the storage device 1300 on the RAM 1200. The codes loaded on the RAM 1200 are executed to run a variety of software, such as operating system, application, and so on. The processor 1100 loads data stored in the storage device 1300 on the RAM 1200 and processes data loaded on the RAM 1200. The processor 1100 stores long-term data of data stored in the RAM 1200 at the storage device 1300.

The storage device 1300 includes a nonvolatile memory, such as, but not limited to, a flash memory, a PRAM (Phase-change RAM), an MRAM (Magnetic RAM), an RRAM (Resistive RAM), an FRAM (Ferroelectric RAM), and so on.

The modem 1400 communicates with an external device according to a control of the processor 1100. For example, the modem 1400 communicates with the external device in a wire or wireless manner. The modem 1400 may communicate with the external device, based on at least one of wireless communications manners such as LTE (Long Term Evolution), WiMax, GSM (Global System for Mobile communication), CDMA (Code Division Multiple Access), Bluetooth, NFC (Near Field Communication), WiFi, RFID (Radio Frequency Identification, and so on or wire communications manners such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2C (Inter-integrated Circuit), HS-I2C, I2S, (Integrated-interchip Sound), S/PDIF (Sony/Philips Digital Interface), MMC (MultiMedia Card), eMMC (embedded MMC), and so on.

The user interface 1500 communicates with a user according to a control of the processor 1100. For example, the user interface 1500 may include user input interfaces such as a keyboard, a keypad, a button, a touch panel, a touch screen, a touch pad, a touch ball, a camera, a microphone, a gyroscope sensor, a vibration sensor, and so on. The user interface 1500 may further include user output interfaces such as an LCD, an OLED (Organic Light Emitting Diode) display device, an AMOLED (Active Matrix OLED) display device, an LED, a speaker, a motor, and so on.

The storage device 1300 may include at least one of storage devices 100 and 200 according to one or more example embodiments of the inventive concepts. The storage device 1300 contains a RAM 123 and a shape encoder and decoder block 126. The processor 1100, RAM 1200, modem 1400, and user interface 1500 may constitute a host device that communicates with the storage device 1300.

Figure 26:
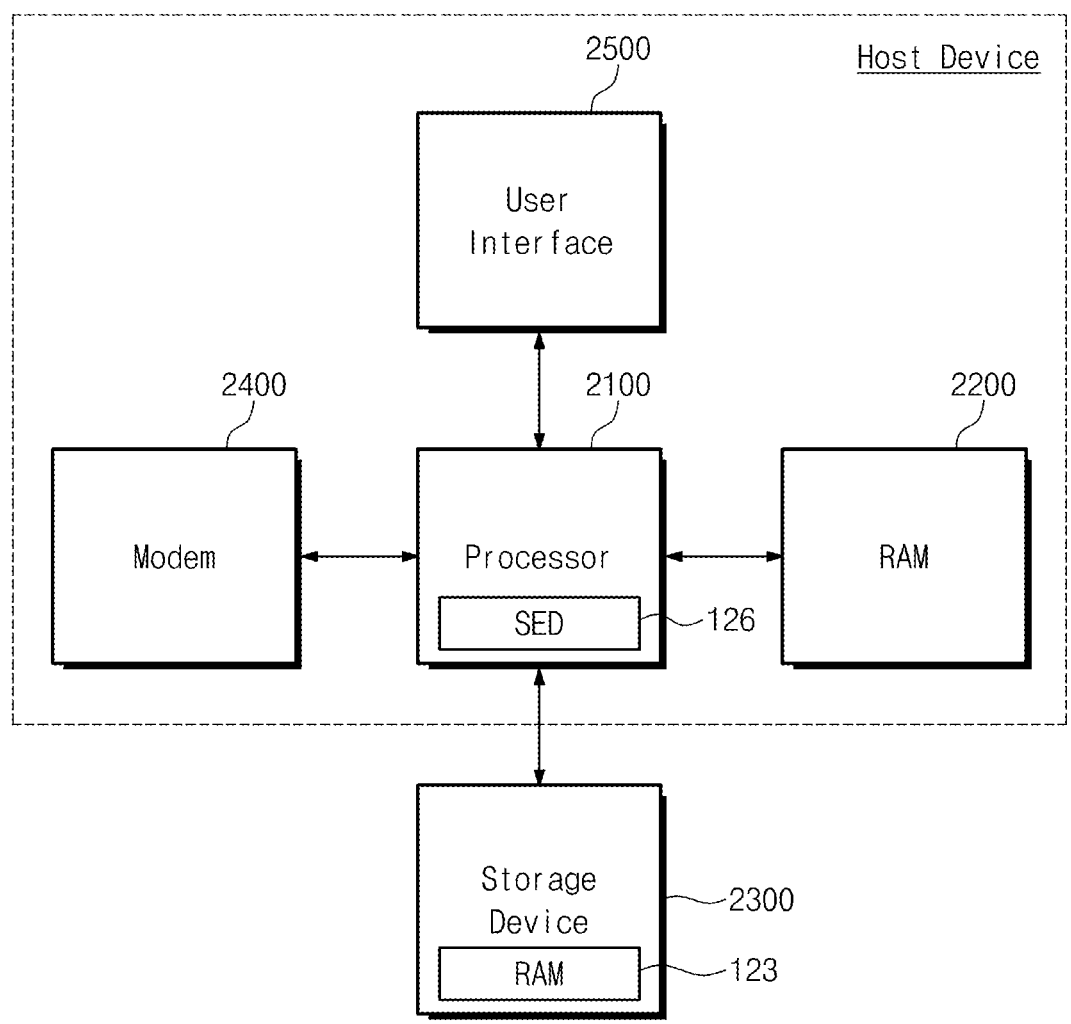
FIG. 26 is a block diagram schematically illustrating a computing device according to at least one or more other example embodiments of the inventive concepts.

FIG. 26 is a block diagram schematically illustrating a computing device 2000 according to at least one or more other example embodiments of the inventive concepts. Referring to FIG. 26, a computing device 2000 contains a processor 2100, a RAM 2200, a storage device 2300, a modem 2400, and a user interface 2500.

Compared to a computing device 1000 illustrated in FIG. 25, a shape encoder and decoder block 126 of the storage device 2000 may be included in the processor 2100 of a host device. The shape encoder and decoder block 126 performs encoding and decoding using the RAM 2200 of the host device instead of a RAM 123. The host device transmits encoded data and decodes data transmitted from the storage device 2300.

The storage device 2300 temporarily stores encoded data from the host device in the RAM 123 and then writes the encoded data. The storage device 2300 temporarily stores read data in the RAM 123 and then outputs it to the host device. The storage device 2300 may include a device having the same structure of at least one of storage devices 100 and 200 described above according to one or more example embodiments of the inventive concepts, with the exception that the SED 126 is included in the processor 2100 instead of the storage device 2300.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. An operating method of a storage device which includes a nonvolatile memory including a plurality of memory cells; and a memory controller adapted to control the nonvolatile memory, the operating method comprising:
receiving write data to be written at the plurality of memory cells, the write data including least significant bit (LSB) data, central significant bit (CSB) data, and most significant bit (MSB) data;
before writing the write data to the plurality of memory cells, encoding the write data by,
encoding the LSB data by changing values of the LSB data,
encoding the CSB data by changing values of the CSB data based on lower data of the CSB data, and
encoding the MSB data by changing values of the MSB data based on lower data of the MSB data,
the lower data of the CSB data being the LSB data,
the lower data of the MSB data being the CSB data and the LSB data.

2. The operating method of claim 1, wherein an LSB, a CSB and an MSB are written at each of the plurality of memory cells,
wherein data that is written as LSBs of data to be written at the plurality of memory cells and is first received is the LSB data,
wherein data that is written as CSBs of data to be written at the plurality of memory cells and is received following the LSB data is the CSB data, and
wherein data that is written as MSBs of data to be written at the plurality of memory cells and is received following the CSB data is the MSB data.

3. The operating method of claim 1, further comprising:
programming each of the plurality of memory cells to have one of at least first to eighth threshold voltage states, each of the at least first to eighth threshold voltage states corresponding to a combination of an LSB, central significant bit (CSB), and most significant bit (MSB), the at least first to eighth threshold voltage states corresponding to at least first to eighth threshold voltage distribution ranges, respectively,
wherein the encoding the LSB data includes encoding the LSB data such that a number of bits in the write data corresponding to an LSB value that is the same as an LSB value of a highest threshold voltage state is reduced, the highest threshold voltage state being the threshold voltage state, from among the at least first to eighth threshold voltage states, that corresponds to a highest threshold voltage distribution range, the highest threshold voltage distribution range being a highest one of the at least first to eighth threshold voltage distribution ranges.

4. The operating method of claim 3, wherein the encoding the CSB data comprises:
detecting bits, from among the encoded LSB data, having a same value as the LSB value of the highest threshold voltage state; and
encoding the CSB data such that, with respect to first data, a number of bits in the first data corresponding to a CSB value that is the same as a CSB value of the highest threshold voltage state, is reduced,
the first data being data, from among the write data, for which values of the encoded LSB data are the same as the LSB value of the highest threshold voltage state.

5. The operating method of claim 4, wherein the encoding the MSB data comprises:
detecting bits, from among the encoded LSB data, having a same value as the LSB value of the highest threshold voltage state;
detecting bits, from among the encoded CSB data, having a same value as the CSB value of the highest threshold voltage state; and
encoding the MSB data such that, with respect to second data, a number of bits in the second data corresponding to a MSB value that is the same as a MSB value of the highest threshold voltage state, is reduced,
the second data being data, from among the write data, for which values of the encoded LSB data are the same as the LSB value of the highest threshold voltage state and values of the encoded CSB data are the same as the CSB value of the highest threshold voltage state.

6. The operating method of claim 1, wherein the encoding the write data includes encoding the write data such that the write data is encoded according to encoding data of second data to be written at second memory cells adjacent to the plurality of memory cells.

7. The operating method of claim 6, further comprising:
writing the encoded write data such that at least an LSB, a CSB, and an MSB are written at each of the plurality of memory cells and each of the second memory cells,
wherein each of the plurality of memory cells and each of the second memory cells has one of the at least first to at least eight threshold voltage states, the at least first to at least eighth threshold voltage states each corresponding to values for an LSB, a CSB, and an MSB, the at least first to eighth threshold voltage states corresponding to at least first to eighth threshold voltage distribution ranges, respectively,
wherein locations of bits, corresponding to a highest threshold voltage state, from among at least first through eighth threshold voltage states, are detected from the encoding data of the second data, and
wherein the write data is encoded such that data corresponding to a lowest threshold voltage state, from among the at least first through eighth threshold voltage states, are not written in memory cells at the detected locations,
the highest threshold voltage state being the threshold voltage state, from among the at least first to eighth threshold voltage states, that corresponds to a highest threshold voltage distribution range, the highest threshold voltage distribution range being a highest one of the at least first to eighth threshold voltage distribution ranges,
the lowest threshold voltage state being the threshold voltage state, from among the at least first to eighth threshold voltage states, that corresponds to a lowest threshold voltage distribution range, the lowest threshold voltage distribution range being a lowest one of the at least first to eighth threshold voltage distribution ranges.

8. The operating method of claim 1, further comprising:
dividing the write data into first write data, second write data, and third write data,
wherein the first write data is selected as the LSB data to be written at the plurality of memory cells as first bits, the second write data is selected as the CSB data to be written at the plurality of memory cells as second bits, and the third write data is selected as the MSB data to be written at the plurality of memory cells as third bits.

9. The operating method of claim 8, wherein the nonvolatile memory further comprises:
first latches, second latches, and third latches connected to the plurality of memory cells, respectively;
second memory cells connected to a same word line as the plurality of memory cells; and
fourth latches, fifth latches, and sixth latches connected to the second memory cells, respectively,
wherein the operating method further includes,
loading encoding data of the first write data on the first latches;
loading encoding data of the second write data on the second latches; and
loading encoding data of the third write data on the third latches.

10. The operating method of claim 9, further comprising:
respectively loading next encoding data on the fourth latches, the fifth latches, and the sixth latches, and then, writing the data loaded on the first to sixth latches at the plurality of memory cells and the second memory cells.

11. An operating method of a storage device which includes a nonvolatile memory including a plurality of memory cells; and a memory controller adapted to control the nonvolatile memory, the operating method comprising:
receiving write data to be written, as a plurality of data units, to the plurality of memory cells,
each of the plurality of data units corresponding to one of at least first through eighth threshold voltage states,
each of the at least first through eighth threshold voltage states corresponding to a different one of a plurality of multi-bit data values,
each of the multi-bit data values including a least significant bit (LSB), at least one central significant bit (CSB), and a most significant bit (MSB);
dividing the write data based on significance of bits of the write data; and
before writing the write data to the plurality of memory cells, encoding the write data by,
changing values of LSB data, from among the write data,
changing values of CSB data, from among the write data, based on data, from among the LSB data, that corresponds to the CSB data, and
changing values of MSB data, from among the write data, based on data, from among the LSB data and CSB data, that corresponds to the MSB data.

12. The method of claim 11, wherein the encoding includes encoding the write data such that a number of data units, from among the plurality of data units, having a same multi-bit data value as a highest multi-bit data value is reduced,
the at least first to eighth threshold voltage states corresponding to at least first to eighth threshold voltage distribution ranges, respectively,
the highest multi-bit data value being the multi-bit data value, from among the plurality of multi-bit data values, to which a highest threshold voltage state corresponds,
the highest threshold voltage state being the threshold voltage state, from among the at least first to eighth threshold voltage states, that corresponds to a highest threshold voltage distribution range,
the highest threshold voltage distribution range being a highest one of the at least first to eighth threshold voltage distribution ranges.

13. The method of claim 11, wherein the CSB data includes a first plurality of CSBs and a second plurality of CSBs, and the encoding includes encoding the CSB data such that,
values of the first plurality of CSBs are changed based on,
a combination of the first CSBs and bits of encoding data of the LSB data corresponding to the first CSBs, and
values of the second plurality of CSBs are changed based on the second plurality of CSBs regardless of the encoding data of the LSB data.

14. The method of claim 11, wherein the MSB data includes a first plurality of MSBs and a second plurality of MSBs, and the encoding includes encoding the MSB data such that,
values of the first plurality of MSBs are changed based on,
a combination of the first MSBs, bits of encoding data of the CSB data corresponding to the first MSBs, and bits of encoding data of the LSB data corresponding to the first MSBs, and
values of the second plurality of MSBs are changed based on the second plurality of MSBs regardless of the encoding data of the LSB data and regardless of the encoding data of the CSB data.

15. The method of claim 11, wherein the nonvolatile memory comprises a three-dimensional memory array which includes the plurality of memory cells.

16. The method of claim 15, wherein the three-dimensional memory array is monolithically formed in one or more physical levels of memory cells having active areas disposed above a silicon substrate.

17. The method of claim 15, wherein each of the memory cells includes a charge trap later.

18. The method of claim 15, wherein word lines and/or bit lines in the three-dimensional array are shared between levels.

19. The method of claim 11, wherein the nonvolatile memory includes a plurality of strings arranged in rows and columns on a substrate,
wherein each string includes at least one select transistor and memory cells stacked on a direction perpendicular to the substrate.

* * * * *